(12) United States Patent
Arimoto et al.

(10) Patent No.: US 8,935,146 B2
(45) Date of Patent: Jan. 13, 2015

(54) COMPUTER AIDED DESIGN APPARATUS, COMPUTER AIDED DESIGN PROGRAM, COMPUTER AIDED DESIGN METHOD FOR A SEMICONDUCTOR DEVICE AND METHOD OF MANUFACTURING A SEMICONDUCTOR CIRCUIT BASED ON CHARACTERISTIC VALUE AND SIMULATION PARAMETER

(75) Inventors: Hiroshi Arimoto, Kawasaki (JP); Seiichiro Yamaguchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 841 days.

(21) Appl. No.: 12/042,059

(22) Filed: Mar. 4, 2008

(65) Prior Publication Data
US 2008/0221854 A1 Sep. 11, 2008

(30) Foreign Application Priority Data

Mar. 5, 2007 (JP) .................................. 2007-054787
Oct. 22, 2007 (JP) .................................. 2007-274149

(51) Int. Cl.
*G06F 17/50* (2006.01)

(52) U.S. Cl.
CPC ........ *G06F 17/5036* (2013.01); *G06F 17/5063* (2013.01); *G06F 17/5022* (2013.01); *G06F 17/5045* (2013.01)
USPC ................... 703/14; 703/2; 703/13; 716/104; 716/111; 716/132

(58) Field of Classification Search
USPC ......... 703/13, 14, 16, 17; 716/1, 4, 5; 702/57, 702/64, 65
See application file for complete search history.

(56) References Cited

U.S. PATENT DOCUMENTS

| 5,313,398 | A | * | 5/1994 | Rohrer et al. | .................... 703/14 |
| 5,553,008 | A | * | 9/1996 | Huang et al. | .................... 703/14 |
| 5,757,679 | A | * | 5/1998 | Sawai et al. | .................... 716/111 |
| 5,764,532 | A | * | 6/1998 | Patel | ............................. 716/113 |

(Continued)

FOREIGN PATENT DOCUMENTS

| JP | 2000-293566 A | 10/2000 |
| JP | 2004-086546 A | 3/2004 |
| JP | 2006-329824 A | 7/2006 |

OTHER PUBLICATIONS

Japanese Notice of Reason for Rejection dated Apr. 3, 2012, issued in corresponding Japanese Patent Application No. 2007-274149.

(Continued)

*Primary Examiner* — Kibrom K Gebresilassie
(74) *Attorney, Agent, or Firm* — Westerman, Hattori, Daniels & Adrian, LLP

(57) ABSTRACT

A simulation instructing unit instructs a simulation unit, which generates signal characteristics, to generate the signal characteristics. A characteristic value extracting unit extracts, from the signal characteristics, characteristic values for distinguishing between a signal characteristic generated by setting a first simulation parameter and a signal characteristic generated by a second simulation parameter. A simulation parameter determining unit determines a first mapping relationship from the characteristic values to the simulation parameters with the characteristic values obtained by setting a plurality of set values in the simulation parameters and with the set values.

23 Claims, 13 Drawing Sheets

(56) References Cited

U.S. PATENT DOCUMENTS

| | | | |
|---|---|---|---|
| 6,031,246 A * | 2/2000 | Hamada et al. | 257/48 |
| 6,219,630 B1 * | 4/2001 | Yonezawa et al. | 703/14 |
| 6,330,526 B1 * | 12/2001 | Yasuda | 703/2 |
| 6,425,111 B1 * | 7/2002 | del Mar Hershenson | 703/2 |
| 6,618,837 B1 * | 9/2003 | Zhang et al. | 716/111 |
| 6,698,000 B2 * | 2/2004 | Tanaka | 716/113 |
| 6,735,558 B1 * | 5/2004 | Yamaguchi | 703/14 |
| 6,861,849 B2 * | 3/2005 | Chiba | 324/663 |
| 7,047,505 B2 * | 5/2006 | Saxena et al. | 716/54 |
| 7,155,685 B2 * | 12/2006 | Mori et al. | 716/133 |
| 7,197,728 B2 * | 3/2007 | Yonezawa | 716/56 |
| 7,268,575 B1 * | 9/2007 | Chen et al. | 324/762.09 |
| 7,315,992 B2 * | 1/2008 | Bhooshan et al. | 716/5 |
| 7,320,116 B2 * | 1/2008 | Mukaihira | 716/5 |
| 7,462,914 B2 * | 12/2008 | Sahara et al. | 257/369 |
| 7,533,359 B2 * | 5/2009 | Scheffer et al. | 716/5 |
| 7,617,056 B2 * | 11/2009 | Seki | 702/57 |
| 7,685,543 B2 * | 3/2010 | Tsuji et al. | 716/106 |
| 7,913,214 B2 * | 3/2011 | Yamada | 716/113 |
| 7,934,178 B2 * | 4/2011 | Arimoto | 716/100 |
| 8,024,674 B2 * | 9/2011 | Arimoto | 716/51 |
| 8,271,254 B2 * | 9/2012 | Kinoshita et al. | 703/14 |
| 8,484,597 B2 * | 7/2013 | Arimoto | 716/113 |
| 8,498,855 B2 * | 7/2013 | Sakamoto | 703/14 |
| 8,555,224 B2 * | 10/2013 | Ishizu et al. | 716/110 |
| 8,789,002 B2 * | 7/2014 | Tanaka | 716/132 |
| 2002/0008252 A1 * | 1/2002 | Koike | 257/200 |
| 2002/0010565 A1 * | 1/2002 | Ho et al. | 703/2 |
| 2002/0156609 A1 * | 10/2002 | Hirata et al. | 703/14 |
| 2003/0117163 A1 * | 6/2003 | Nishimura | 324/765 |
| 2004/0044511 A1 * | 3/2004 | Sekido et al. | 703/14 |
| 2004/0064296 A1 * | 4/2004 | Saxena et al. | 703/2 |
| 2005/0086033 A1 * | 4/2005 | Chen et al. | 703/2 |
| 2005/0138581 A1 * | 6/2005 | Usui | 716/4 |
| 2005/0172251 A1 * | 8/2005 | Chang et al. | 716/6 |
| 2005/0278677 A1 * | 12/2005 | Ang et al. | 716/9 |
| 2005/0288918 A1 * | 12/2005 | Chen et al. | 703/22 |
| 2006/0142987 A1 * | 6/2006 | Ishizu et al. | 703/14 |
| 2006/0150132 A1 * | 7/2006 | Gupta | 716/5 |
| 2006/0173667 A1 * | 8/2006 | Sumikawa | 703/14 |
| 2006/0224255 A1 * | 10/2006 | Tanaka et al. | 700/42 |
| 2006/0282249 A1 * | 12/2006 | Ikoma et al. | 703/13 |
| 2006/0282804 A1 * | 12/2006 | Ang et al. | 716/4 |
| 2007/0106966 A1 * | 5/2007 | Inoue et al. | 716/4 |
| 2008/0028342 A1 * | 1/2008 | Tsuji et al. | 716/2 |
| 2008/0109767 A1 * | 5/2008 | Arimoto | 716/2 |
| 2008/0195983 A1 * | 8/2008 | Chidambarrao et al. | 716/2 |
| 2009/0089037 A1 * | 4/2009 | Yamada | 703/14 |
| 2009/0172611 A1 * | 7/2009 | Tanaka | 716/4 |
| 2009/0249263 A1 * | 10/2009 | Arimoto | 716/2 |
| 2009/0306953 A1 * | 12/2009 | Liu et al. | 703/14 |
| 2011/0093245 A1 * | 4/2011 | Matsuoka | 703/2 |
| 2011/0237005 A1 * | 9/2011 | Kim et al. | 438/16 |

OTHER PUBLICATIONS

Japanese Notice of Reason for Rejection dated Sep. 4, 2012, issued in corresponding Japanese Patent Application No. 2007-274149 (with English Translation).

English translation of claims 1-3 and 8 of corresponding Japanese Application No. 2007-274149.

* cited by examiner

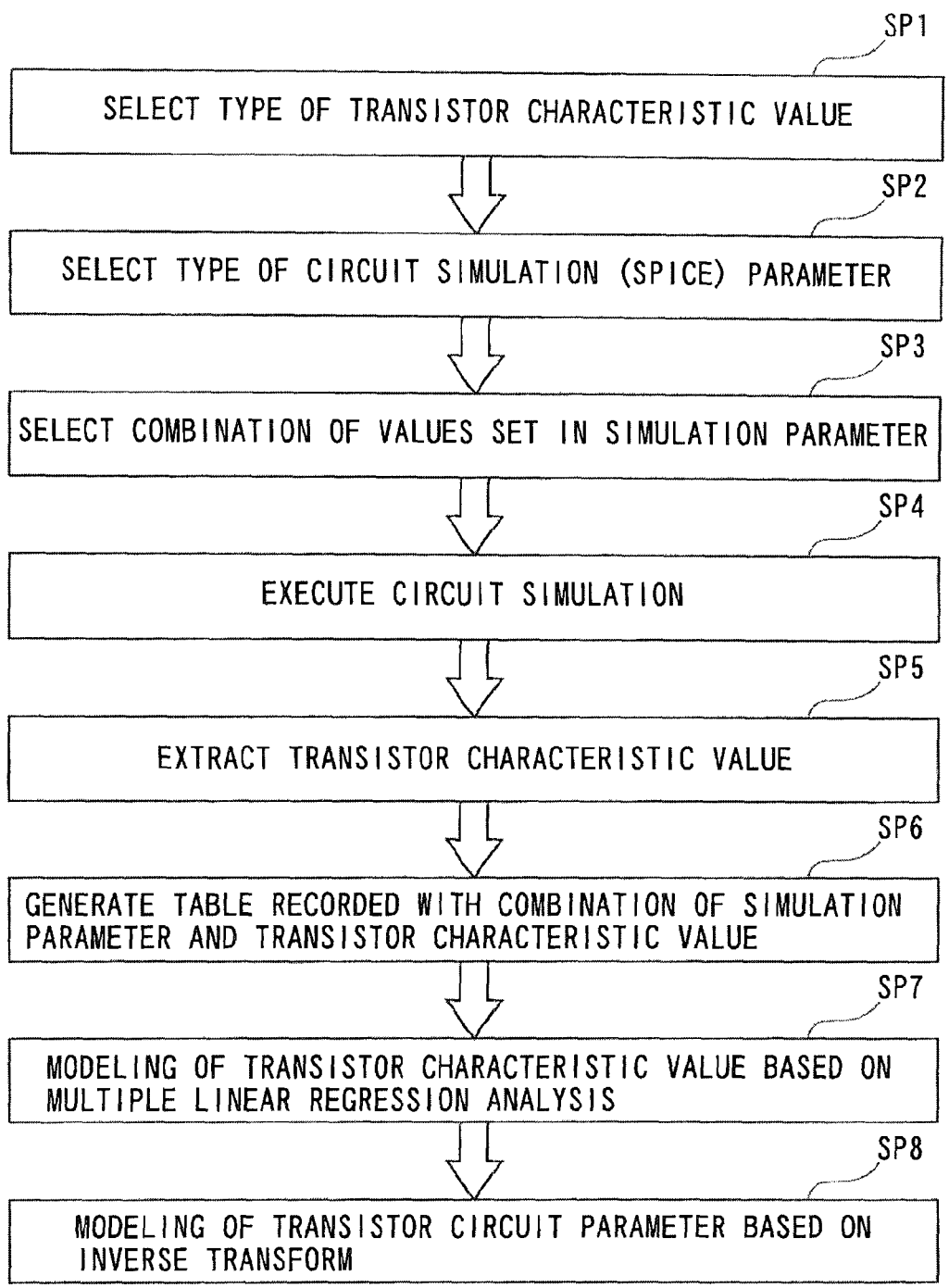

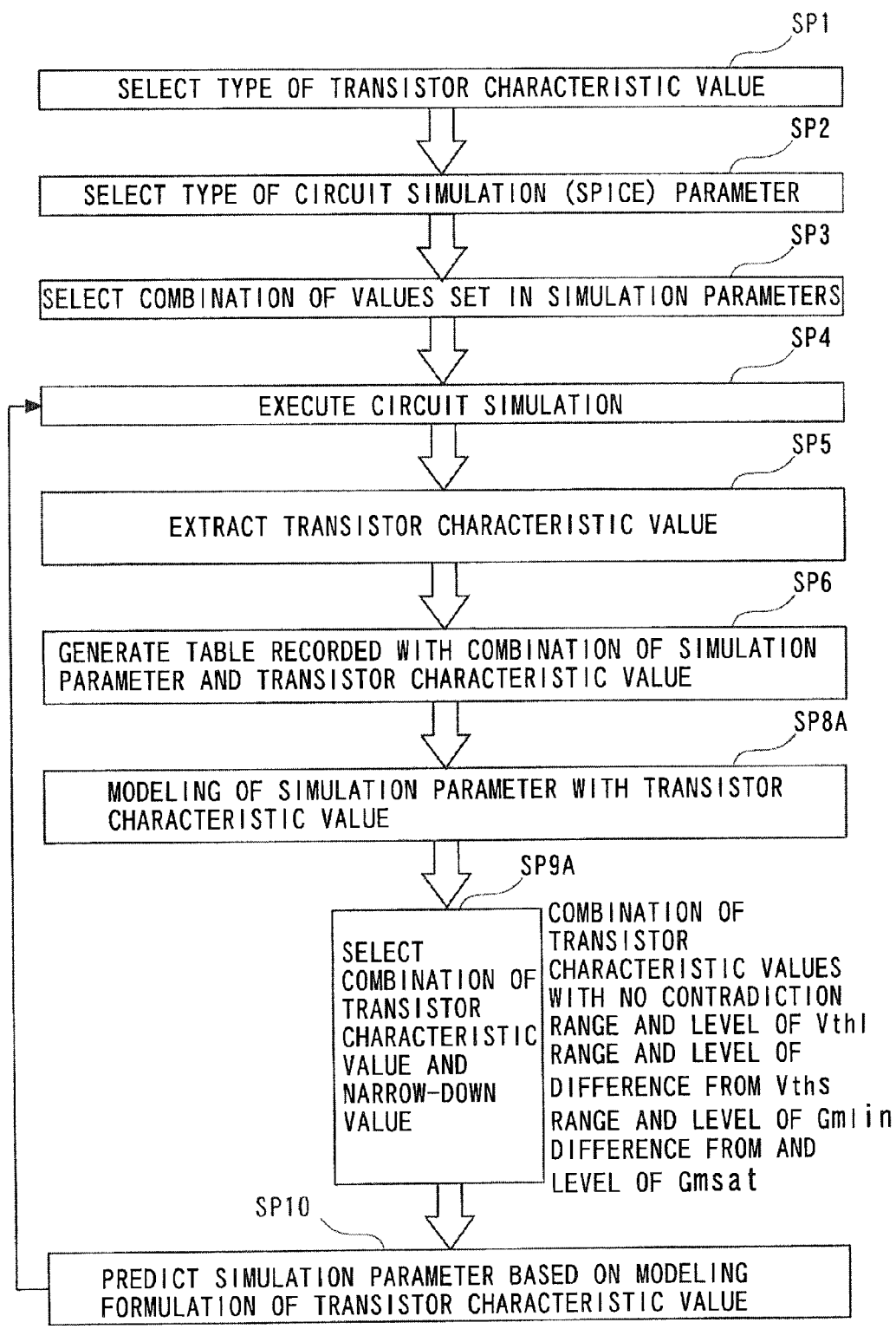

COMPUTER AIDED DESIGN APPARATUS, COMPUTER AIDED DESIGN PROGRAM, COMPUTER AIDED DESIGN METHOD FOR A SEMICONDUCTOR DEVICE AND METHOD OF MANUFACTURING A SEMICONDUCTOR CIRCUIT BASED ON CHARACTERISTIC VALUE AND SIMULATION PARAMETER

This application claims the benefit of Japanese Patent Application No. 2007-054787 filed on Mar. 5, 2007 and Japanese Patent Application No. 2007-274149 filed on Oct. 22, 2007 in the Japanese Patent Office, the disclosure of which is herein incorporated in its entirety by reference.

BACKGROUND

An electronic circuit design technology and an electronic circuit manufacturing technology is illustrated.

Over the recent years, with advanced micronization of LSI, circuit characteristics are greatly influenced by a difference of a layout pattern of circuit elements, a difference of a positional relationship in the layout pattern or a slight process change in a manufacturing process. Further, a method of taking the influence thereof into prediction of transistor characteristics is proposed.

Execution of the circuit simulation using the predicted transistor characteristics, however, entails replacing the difference of the transistor characteristic with a parameter employed in the circuit simulation. None of a specific converting method thereof was not, however, proposed.

Therefore, a conventional scheme is to obtain, for example, a relationship between the layout pattern of the circuit elements and an empirically-acquired pattern formed on a substrate and a relationship between such a pattern on the substrate and actual values of the transistor characteristics. Then, there are obtained correction values of the layout pattern of the circuit elements so that a result of the simulation conforms to the actual values of the transistor characteristics. Subsequently, the parameters of the circuit simulation are acquired based on the corrected layout pattern when the result of the simulation conforms to the actual value.

SUMMARY

According to an aspect of the invention, an apparatus has a simulation instructing unit instructs a simulation unit which simulates an operation of a transistor with simulation parameters and generates signal characteristics of the transistor, a characteristic value extracting unit extracts, from the signal characteristics, characteristic values for distinguishing between a first signal characteristic generated by setting a first value in the simulation parameters and a second signal characteristic generated by setting a second value different from the first value in the simulation parameters, a simulation parameter determining unit determines a first mapping relationship to the simulation parameters from the characteristic values with a combination of the characteristic values and the set values. Then, the characteristic values are respectively obtained by setting a plurality of set values in the simulation parameters.

BRIEF DESCRIPTION OF THE DRAWINGS

FIG. 4 is a flowchart of a process of modeling transistor characteristics and the simulation parameters on the basis of the circuit simulation;

FIG. 12 is a flowchart illustrating a process of the computer aided design equipment according to a fifth embodiment.

DETAILED DESCRIPTION

A circuit design technology and a technology of manufacturing an electronic circuit device in accordance with design data based on the circuit design technology according to an embodiment will hereinafter be described with reference to the drawings.

With this configuration, the technology enables the simulation parameters to be acquired by applying a first mapping relationship when given signal characteristics or characteristic values about circuit components building up a circuit. It is therefore feasible to instruct a simulation unit which simulates the operations of the circuit components with the simulation parameters, to generate the signal characteristics of the circuit constructed by combining the corresponding circuit components by use of the thus-acquired simulation parameters.

According to the technology, immediately when given the characteristics of the circuit components, the simulation parameters for simulating the circuit including the circuit components can be obtained.

Figure 1:
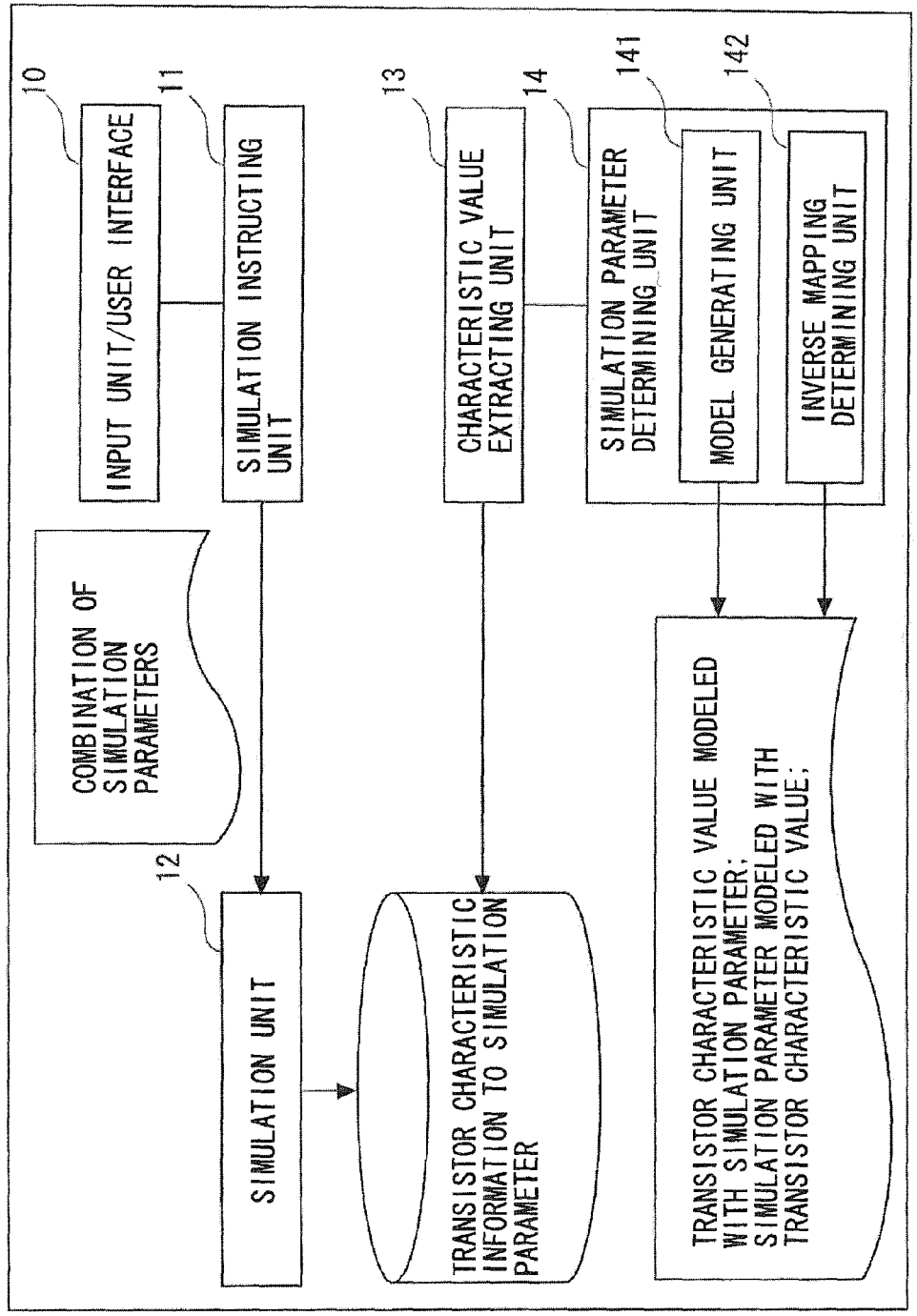
FIG. 1 is a block diagram of functions of computer aided design equipment.

FIG. 1 illustrates a block diagram of functions of computer aided design (CAD) equipment. The computer aided design equipment is realized as one function of a computer system for designing Large Scale Integration (LSI) The computer system assumed herein is realized on a general type of computer. The computer includes, e.g., a Central Processing Unit (CPU), a memory, an external storage device, for example, a hard disk, a driving device for a removable portable recording medium, etc., an interface with the external storage device, a communication interface, a display device, and an input/output device, for example, a keyboard, a pointing device such as a mouse, and so on.

The present computer aided design equipment is realized by a computer program executed by this type of computer. The computer program is installed into the hard disk via the communication interface or the driving device for the removable portable recording medium. The CPU loads the installed computer program into the memory and then executes the program. The functions of the computer aided design equipment are thereby realized. Further, the computer provides the functions of the computer aided design equipment, whereby a computer aided design method is carried out.

As in FIG. 1, the computer aided design equipment includes an input unit/user interface 10 that accepts a user's operation, a simulation instructing unit 11 that starts a process according to an instruction of the input unit/user interface 10 and instructs the simulation unit 12 to execute simulation by setting simulation parameters, a characteristic value extracting unit 13 that extracts a transistor characteristic value from transistor characteristic information generated by the simulation unit 12, and a simulation parameter determining unit 14 that models the simulation parameter and the transistor characteristic value according to the characteristic value extracted by the characteristic value extracting unit and the simulation parameter.

The input unit/user interface 10 controls the input device and the display device, and builds up a user interface. The input unit/user interface 10 accepts an input from the user, starts up the process, and displays a processing result on the display device.

The simulation unit 12 is a simulation program such as Simulation Program Integrated Circuits Especially (SPICE). Herein, the term "unit" may be defined as a software module. The simulation unit 12 simulates an operation of a circuit assembled by multiple circuit components. The circuit operation illustrated by the simulation unit 12 embraces a current/voltage characteristic, delay time and power consumption of each of the circuit components included in the circuit. Further, the circuit operation illustrated by the simulation unit 12 embraces a current/voltage characteristic, delay time and power consumption of the whole circuit. In the present embodiment, a transistor is assumed to be the circuit component. The simulation unit 12 accepts a multiplicity of simulation parameters for designating characteristics of the circuit components, and executes the simulation.

Herein, the simulation parameter is defined as a parameter for determining the operation of the circuit component by designating the value of the parameter. The simulation unit 12 reproduces the characteristics of the circuit components that are designated by the parameters, and thus simulates the operation of the whole circuit constructed of a combination of these circuit components. Through the simulation, a designer can, if the current/voltage characteristics of the circuit components are already known, confirm the operation of the whole circuit assembled by combining the plural circuit components.

The simulation instructing unit 11 sets plural combinations of simulation parameters for an individual circuit component, e.g., a transistor. The plural combinations of simulation parameters are set within a range defined by designating, e.g., a minimum value and a maximum value at intervals of a predetermined numerical value. Then, the simulation instructing unit 11 instructs the simulation unit 12 to execute the simulation using such combinations of simulation parameters.

As a result, the transistor characteristic information with respect to the simulation parameters is generated. Herein, the transistor characteristic information is exemplified such as a current/voltage characteristic expressed by a combination (Vg, Vd, Id) of a gate voltage Vg, a drain voltage Vd and a drain current Id.

The characteristic value extracting unit 13 selects a characteristic value from the transistor characteristic information and sets the selected value as a transistor characteristic value. The transistor characteristic value represents, for example, when the gate voltage Vg is fixed to a predetermined value, a drain current value Id1 with respect to a drain voltage Vd1, a drain current Id2 with respect to a drain voltage Vd2, and so on. Further, the transistor characteristic value represents, when the drain voltage is fixed to a predetermined value, a threshold value Vth obtained as an intersection between an axis of the drain voltage Vd and a tangential line having a maximized micro increment which is a tangential line showing a gradient of the drain current with respect to a micro quantity of variation in the gate voltage. Here, the tangential line is abutting the current/voltage characteristics line at the gate voltage.

The simulation parameter determining unit 14 models a relationship between the combination of the simulation parameters inputted to the simulation unit 12 and the transistor characteristic value obtained as a result of the simulation. The term "modeling" connotes generating a mapping relationship from one type of value to another. The mapping relationship represents a relationship enabling the value to be determined uniquely from one or more variables, and can be exemplified by a polynomial expression of these variables.

In the present embodiment, the simulation parameter determining unit 14 has a model generating unit 141 and an inverse mapping determining unit 142. The model generating unit 141 determines the mapping to the transistor characteristic value from the simulation parameter. The mapping expresses the transistor characteristic value in the polynomial expression, in which the variables are the simulation parameters, according to a procedure of, e.g., a multiple linear regression analysis. Further, the inverse mapping determining unit 142 obtains inverse mapping for inversely transforming the mapping generated by the model generating unit 141. With this operation, the inverse mapping determining unit 142 expresses the simulation parameters in the polynomial expression, where the variables are the transistor characteristic values.

As a result, according to the present embodiment, when the transistor characteristic information is temporarily given in the form of the combination of (Vg, Vd, Id), the transistor characteristic value is generated from these values, and the simulation parameter can be immediately acquired. As a result, a user is enabled to check the operation characteristics of the whole circuit in a way that gives the transistor characteristic information in the form of the combination of (Vg, Vd, Id) to the present computer aided design equipment and executes the simulation of the whole circuit with respect to the circuit including the plurality of transistors having the transistor characteristics thereof.

It is to be noted that the embodiment is not necessarily limited to the process in which the simulation parameter determining unit 14 at first models the transistor characteristic value and thereafter models the simulation parameter by obtaining the inverse mapping. Namely, from the result of the simulation, the simulation parameter may also be directly modeled with the transistor characteristic value. This procedure will be exemplified otherwise by way of a modified example.

A circuit design method and the computer aided design equipment that supports the circuit design based on this circuit design method according to a first embodiment, will hereinafter be described with reference to the drawings in FIGS. 2 through 5.

The computer aided design equipment is given the characteristics of the circuit components building up the circuit, and provides a function of obtaining parameters (the simulation parameters) of a simulation program for simulating the circuit components.

The simulation parameters are typically a threshold value (Vth0) of a long channel, a saturation velocity (VSAT), a mobility (U0), a gate length (Lg), a gate width (W), dependency of the threshold value upon the drain voltage, a floating body effect, an under-the-gate penetrating diffusion length, etc.

Note that the simulation parameters may also be parameters into which to express differences from reference values of the parameters such as the threshold value (Vth0) of the long channel, the saturation velocity (VSAT), the mobility (U0), the gate length (Lg), the gate width (W), the dependency of the threshold value upon the drain voltage, the floating body effect and the under-the-gate penetrating diffusion length, or to express quantities of variations thereof by use of a ratio. Namely, deviation quantities from respective standard parameter values in the standard transistors may also be defined. As described above, these parameters are determined for every simulation program.

Among those parameters, the gate length (Lg), the gate width (W), etc are physical quantities corresponding to a gate length and a gate width in a net list. There might be, however, a case in which it is not appropriate to use the design data as it is for the substitution of the simulation parameters even if the simulation parameters correspond to the design data.

When film formation, photolithography, etching, etc are conducted based on the design data, a shape and dimensions of a pattern on a substrate are not necessarily coincident with the shape and the dimensions of the design data. Accordingly, the simulation parameters need setting values that reflect a physical shape formed on the substrate in order to acquire a result of the precise circuit simulation. It is known that especially the gate length (Lg) is easy to be affected by a peripheral layout and exerts great influence on the transistor characteristic, for example, a change in the threshold value due to a short channel effect. Such being the case, if the layout dependency of the gate length Lg can be expressed in a model formula or a table etc, the simulation unit 12 executes the simulation for every plural gate lengths Lg, and a relationship between the combination of the simulation parameters and the transistor characteristic values acquired as a result of the simulation is modeled per gate length Lg, thereby enabling further improvement to be attained. As a matter of course, in the case of converting the transistor characteristic depending on the layout into the simulation parameter according to the present working example, it is required that an optimum (a specified gate length Lg) model be selected by referring to the model formula about the layout dependency of the gate length Lg or the table. The same effect is also acquired by preparing such a model that the gate length Lg is added as one of the simulation parameters in place of having the model formula per Lg. As a matter of course, when simulating the circuit characteristics by use of the extracted simulation parameters including, for example, gate length Lg, it is required that dependency of the gate length Lg of each transistor in the net list be the same dependency as the layout dependency model of the gate length Lg or the table, which are employed in the converting process.

Further, the simulation parameters include the parameter such as the threshold value (Vth0) of the long channel that does not correspond to the design data or the transistor characteristic as the design value. The threshold value (Vth0) of the long channel connotes a threshold value when the channel length is sufficiently large, and represents a parameter that can not be set as the transistor characteristic at the gate length of the circuit to be designed in actuality.

Moreover, the saturation velocity (VSAT) is the parameter specifying a degree to which a rule that a velocity of electrons is proportional to an electric field with the mobility serving as a proportional coefficient is not established. There is no existence of any guideline showing what value should be set in such a parameter.

A scheme in the present embodiment is, as described below, to model the relationship between the transistor characteristic values and the simulation parameters.

Figure 2:
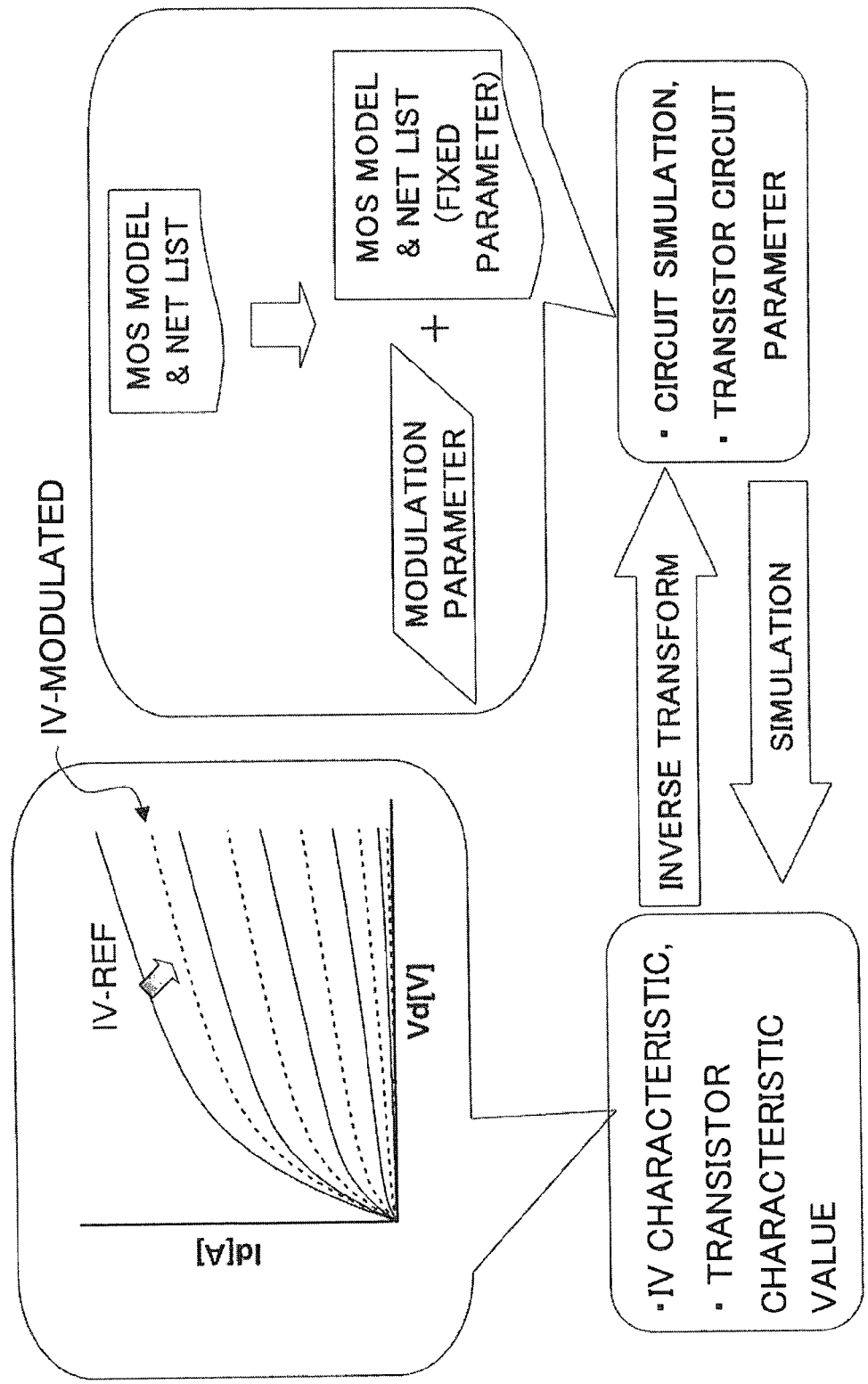
FIG. 2 is a diagram illustrating a first process of modeling transistor characteristic values with simulation parameters on the basis of circuit characteristic simulation, and a second process of modeling the simulation parameters with the transistor characteristic values.

FIG. 2 is a diagram illustrating a first process (depicted by [simulation] in FIG. 2) of modeling the transistor characteristic values with the simulation parameters on the basis of the circuit characteristic simulation, and illustrating a second process (depicted by [inverse transform] in FIG. 2) of modeling the simulation parameters with the transistor characteristic values. In the present embodiment, the second process of modeling the simulation parameters with the transistor characteristic values involves solving inversely the model formula acquired in the first process or alternatively performing the modeling by inverse transform.

Thus, there exist a tremendous number of simulation parameters, which can be set when executing the circuit characteristic simulation. The computer aided design equipment classifies, based on setting given from the user, the multiplicity of simulation parameters into the parameters shown as "modulation parameters" in FIG. 2 in which set values should be changed and into the parameters referred to as "fixed parameters" in which fixed values are set. It is noted that in the following discussion, the modulation parameter is simply termed the simulation parameter.

Then, the computer aided design equipment executes a circuit characteristic simulation program about multiple combinations of plural simulation parameters. Through this execution, the transistor characteristic information about each combination of simulation parameters is obtained. The transistor characteristic information is obtained as a current/voltage characteristic between the source and the drain when, e.g., the gate voltage is fixed. Further, the transistor characteristic information is obtained as a gate voltage/drain current characteristic when the drain voltage is fixed. These transistor characteristics are acquired as, for example, the combination of the gate voltage, the drain voltage and the drain current Vgi, Vdi, Idi, where i is an integer.

Then, the computer aided design equipment extracts a value which will hereinafter be called the transistor characteristic value that characterizes the transistor characteristic information from the acquired transistor characteristic information. This value is, e.g., the drain current when the gate voltage Vg and the drain voltage Vd take the predetermined values. Further, this value is, for example, a mutual conductance obtained as a ratio of a quantity of variation in the drain current to a quantity of variation in the gate voltage when the drain voltage is set to the predetermined value in a linear region.

The computer aided design equipment extracts a plurality of these transistor characteristic values. Then, the computer aided design equipment records a relationship between the combination of the simulation parameters and the combination of the acquired transistor characteristic values. Subsequently, when acquiring the combination of transistor characteristic values with respect to the plural combinations of the simulation parameters, the mapping relationship to the transistor characteristic values from the simulation parameters is obtained. It may be sufficient that the mapping relationship expresses the transistor characteristic values in, e.g., the polynomial expression of the simulation parameters. The polynomial expression can be obtained by performing, e.g., the multiple linear regression analysis. The multiple linear regression analysis is an analyzing method of fitting a value which is also called a response variable in the polynomial expression to the characteristic value to be acquired in a way that determines a coefficient in the term of independent variables with a plurality of variation quantities being set as the independent variables. The term of the polynomial expression is generally equal to or higher than being linear and may contain a product of a plurality of variables. Normally, the coefficient is determined so as to minimize errors between the object characteristic value and the value of the polynomial expression in predetermined domains of the independent variables. Note that an operation of acquiring a formula for predicting one response variable with one independent variable is called a simple linear regression analysis, and this formula can be obtained by a least square method. As broadly known, in the least square method, the coefficient of the formula is determined to minimize a sum of squares of errors between the response variables and actual values. The multiple linear regression analysis is what this is extended to the plurality of variables.

For example, the description will be made by exemplifying a case in which the polynomial expression is Y=F(x1, x2, ..., xn), where F(x1, x2, ..., xn) is the polynomial expression of x1, x2, ..., xn. For example, the polynomial expression is given such as F(x1, x2, ..., xn)=a0+a1·x1+, ..., +am·x1·...·Xn.

In this case, with respect to a combination Yi, x1i, x2i, ..., xni, where i is the integer, of the actual values of the independent variables x1, x2, ..., xn and the response variable Y, the error is defined by ERROR=(Yi−F(x1, x1i, x2i, ..., xni))2, and a coefficient a0, ..., am is determined so as to minimize the error.

Generally, this error is partially differentiated by each coefficient a0, ..., am, and the minimum value is determined. The error is given in the quadratic equation of the coefficient a0, ..., am, and hence it becomes the linear equation after being partially differentiated. Accordingly, the operation of obtaining the error minimized resolves itself into solving a simultaneous equation. A solution of the linear equation on the computer is well known, and hence its explanation is omitted.

It follows that the relationship between the simulation parameters and the transistor characteristic values is acquired by executing the program for processing this type of multiple linear regression analysis.

Once the transistor characteristic values are expressed by the polynomial expression of the simulation parameters, the computer aided design equipment inversely transforms the simulation parameters into the polynomial expression of the transistor characteristic values. This is a process of solving the simultaneous equation organized by the combinations of the plural transistor characteristic values expressed in the polynomial expression of the simulation parameters. As a result, the computer aided design equipment, when the transistor characteristic values are obtained, immediately can acquire the simulation parameters. Accordingly, the simulation of the circuit characteristic can be immediately executed.

Figure 3:
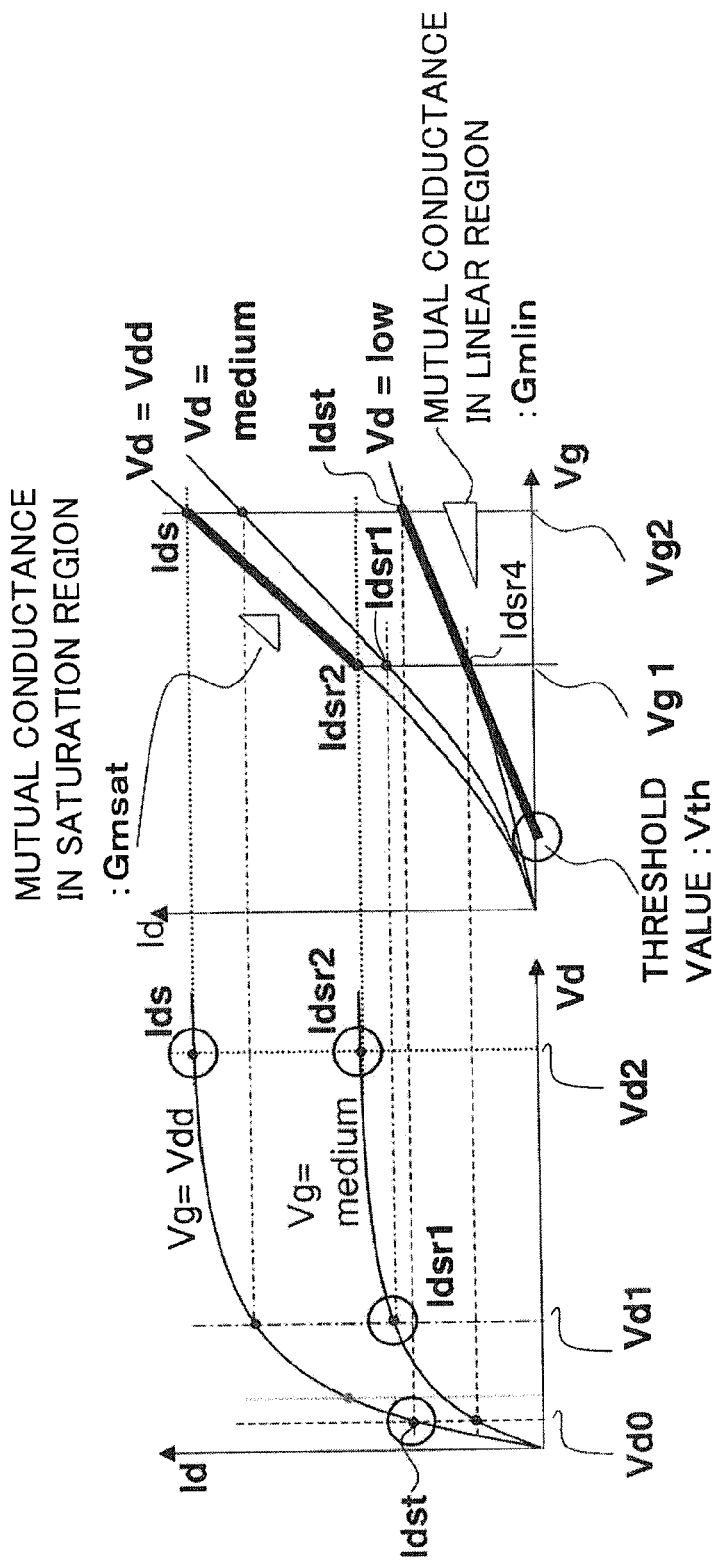
FIG. 3 is a diagram illustrating an example of the transistor characteristic.

FIG. 3 illustrates an example of the transistor characteristic values. This example illustrates, as the transistor characteristic information, the relationship between the drain voltage Vd and the drain current Id when the gate voltage Vg is fixed and the relationship between the gate voltage Vg and the drain current Id when the drain voltage Vd is fixed.

In FIG. 3, the current/voltage characteristic of the single transistor is expressed by a curve. What is actually obtained by the simulation is a combination of discrete values of the gate voltage Vg, the drain voltage Vd and the drain current Id. The transistor characteristic value is the value that characterizes the current/voltage characteristic of the single transistor, and is prescribed by a value itself, a gradient, an intercept, a tangential line, etc at a specified point of the current/voltage characteristic. The characteristic values used by the computer aided design equipment will hereinafter be exemplified.

(1) It is feasible to exemplify the drain current value Id with respect to the specified drain voltage Vd when the gate voltage Vg is fixed. For example, the transistor characteristic values involve using (Vd0, Idst), (Vd2, Ids) when fixed to Vg=Vdd and (Vd1, Idsr1), (Vd2, Idsr2) when fixed to Vg=medium value ("medium" in FIG. 3).

(2) When the drain voltage is fixed, the mutual conductance in the linear region is exemplified. For instance, a ratio of ΔVg=Vg2−Vg1 to ΔId=Ids−Idsr2 in the saturation region when fixed to Vd=Vdd, is calculated as the mutual conductance in the saturation region. The calculation of the ratio given by ΔId/ΔVg corresponds to a predetermined arithmetic operation.

(3) The threshold value of the transistor can be exemplified. For example, the drain current when under at least one gate voltage (Vgs) applying condition (where the source/drain voltage Vds=fixed, a substrate bias Vbs=0) under the linear region condition and the threshold value under the linear region condition, can be exemplified as the transistor characteristic values. The threshold value can be, as illustrated in FIG. 3, calculated as an intersection Vth between the axis of abscissa (Vg-axis) and a tangential line of Vg1 at such a point as to maximize a micro increment quantity (the tangential line representing a gradient) of the drain current with respect to a quantity of micro variation of the gate voltage on the gate voltage/drain current characteristic curve when the drain voltage is fixed. Further, for example, when Vd=low, an intersection with the Vg-axis of the tangential line at a point (Vg1, Idsr4) is calculated as the threshold value Vth. The calculation of this threshold value corresponds to a predetermined arithmetic operation.

(4) The drain currents can be exemplified when under at least two types of gate voltage applying conditions (where Vbs=0) with the same drain voltage under the saturation region condition. Namely, the drain currents can be defined as (Vg1, Ids2), (Vg2, Ids) on the same gate voltage/drain current characteristic curve. In this case, the drain voltage is set to the power source voltage Vdd, the gate voltage is the power source voltage Vdd, and at least one of other gate voltages may be set equal to or smaller than ½ of a sum of the power source voltage Vdd and the threshold value.

(5) The drain currents when under at least two types of drain voltage applying conditions (where Vbs=0) with the same gate voltage under the saturation region condition, may also be available. In this case, the gate voltage may be set equal to or smaller than ½ of the sum of the power source voltage Vdd and the threshold value.

(6) Under the voltage conditions (3) through (5) among the conditions given above, the drain current when a predetermined value is set in a body voltage Vbs (which is also referred to as a substrate bias) may also be used.

(7) A combination of the characteristic values under the conditions (3) and (4) among the conditions given above may also be used. Namely, there may be set, as the available characteristic values, a combination of the drain current when under at least one gate voltage (Vgs) applying condition, where the source/drain voltage Vds=fixed, and the substrate bias Vbs=0, under the linear region condition, the threshold value under the linear region condition, the drain current when under at least two types of gate voltage applying conditions (where Vbs=0) with the same drain voltage under the saturation region condition and the drain currents when under at least two types of drain voltage applying conditions (where Vbs=0) with the same gate voltage under the saturation region condition.

Further, a combination of the conditions (3), (4) and (5) may also be employed. Namely, there may be set, as the available characteristic values, a combination of the drain current when under at least one gate voltage (Vgs) applying condition, where the source/drain voltage Vds=fixed, and the substrate bias Vbs=0, under the linear region condition, the threshold value under the linear region condition and the drain current when under at least two types of gate voltage applying conditions (where Vbs=0) with the same gate voltage under the saturation region condition.

Moreover, a combination of the conditions (3), (4), (5) and (6) may also be employed. Namely, the combinations given above may be further combined with a value when the substrate bias Vbs=0 and a value when the substrate bias is not 0.

(8) In addition to those described above, the characteristic values may involve using the mutual conductance (Gmlin) in the linear region, the drain voltage dependency ($\Delta$th) of the threshold value and the floating body effect. Among these characteristic values, the drain voltage dependency ($\Delta$th) of the threshold value can be defined as, for example, $\Delta$th=(Idsr2−Idsr1)/(Ids−Idsr2), which is a ratio of a difference between the drain current Idsr1 in the case of the drain voltage Vd1 when fixed to Vg=medium value ("medium" in FIG. 3) and the drain current Idsr2 in the case of the drain voltage Vd2 to a difference between the drain current Idsr2 in the case of the gate voltage Vg1 when fixed to Vd=Vdd and the drain current Ids in the case of the gate voltage Vg2. The calculation of this ratio $\Delta$th corresponds to the predetermined arithmetic operation.

Furthermore, the floating body effect can be defined such as a threshold value variation rate=(Vth1−Vth2)/(Vbs1−Vbs2) when changing the body voltage Vbs. In this case, "Vd" is set as a predetermined value. Note that a change in the mutual conductance may also be used as the floating body effect in place of the threshold value. The calculation of the floating body effect corresponds to the predetermined arithmetic operation. It should be noted that the predetermined arithmetic operation is not limited to the above-described calculations of the mutual conductance, $\Delta$th, the floating body effect, etc.

These characteristic values are calculated by the computer program executed on the computer aided design equipment.

FIG. 4 is a flowchart of a process of modeling the transistor characteristic information and the simulation parameters on the basis of the circuit simulation.

To start with, in SP1, a type of the characteristic value, which should be extracted from the transistor characteristic information, is selected. Herein, in the characteristic values that can be calculated by the characteristic value calculation program of the computer aided design equipment among the plurality of characteristic values including the exemplified values (1)-(8), a characteristic value desired by the user is selected as the characteristic value described above. It is preferable that the number of the characteristic values of the transistor be, if possible, same as the number of the changeable simulation parameters. Further, it is also preferable to select such a characteristic value that the transistor characteristic value changes corresponding to a predicted quantity of the physical variation in a way that changes as independently as possible.

For example, with respect to a change in a channel impurity concentration and a change in the gate length, when fixed to Vg=medium value ("medium" in FIG. 3) and to the drain voltage=medium value ("medium" in FIG. 3), the drain current Idsr1 changes comparatively independently. On the other hand, the mutual conductance in the linear region has a high correlation with the mobility of the electrons.

Next in SP2, the simulation parameters, for example, the modulation parameters used in the circuit simulation are selected. These parameters are predetermined for every simulation program.

Herein, the simulation parameters that should be modeled in the way of being associated with the transistor characteristic information, for example, the modulation parameters of which the values should be changed are selected from within the multiplicity of parameters. With this selection, it follows that the simulation parameters, which vary with the change in the transistor characteristic information, in other words, the transistor characteristic values, are determined.

Next in SP3, the combination of values, which are set in these simulation parameters, are selected. The computer aided design equipment determines a maximum variation quantity changeable region defined by the minimum value and the maximum value of each of the selected simulation parameters and also determines an interval at which the simulation is conducted, and selects, based on these determined elements, the combination of the simulation parameters. At this time, round-robin combinations of all the simulation parameters may also be set. Alternatively, an optimum combination as the minimum required according to an orthogonal table may also be set based on an experimental design method which is simply called as experimental design. The orthogonal table is an allocation table for an experiment having such a property that all the combinations of the set values of the simulation parameters occur the same number of times with respect to arbitrary two factors which are herein the types of the simulation parameters. In the case of determining the set values at random, the experiments are required to be done a number of times corresponding to at least a product of the numbers of combinations of the set values of the simulation parameters. Accordingly, the number of the experiments reaches to a tremendous number if the number of the simulation parameters increases. The well-known orthogonal method based on the experimental design enables reduction in the number of the combinations by selecting the parameters having a small dependent relationship. Next, in the computer aided design equipment, the simulation unit 12 executes the circuit simulation per combination (SP4). For example, the SPICE-based simulation is carried out. As a result of the simulation conducted by the simulation unit 12, the combination of the gate voltage Vg, the drain voltage Vd and the drain current Id (Vgi, Vdi, Idi, where i is the integer) is obtained for the simulation parameter designated by the user.

Figure 5A:
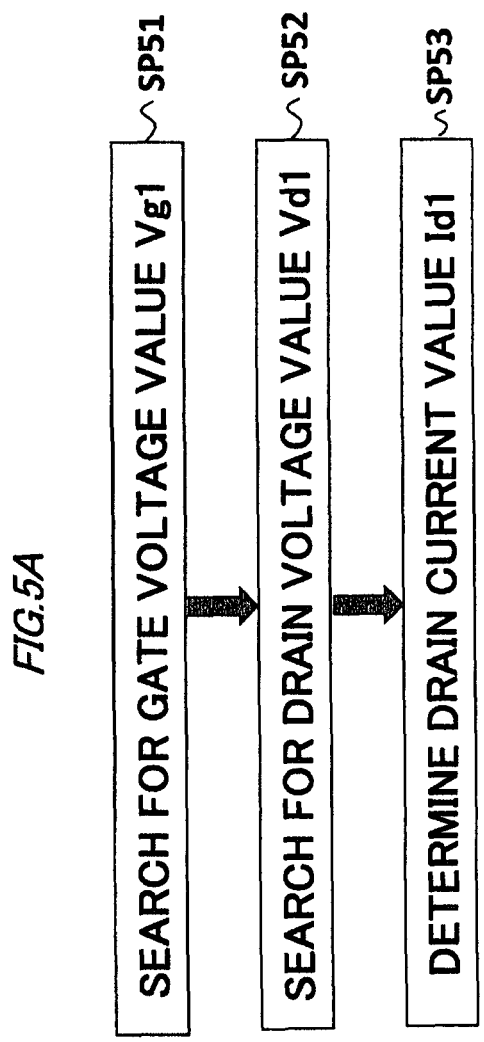
FIG. 5A is a flowchart illustrating a process of obtaining a drain current with respect to a drain voltage Vd1 when a gate voltage is fixed to a predetermined value.
Figure 5B:
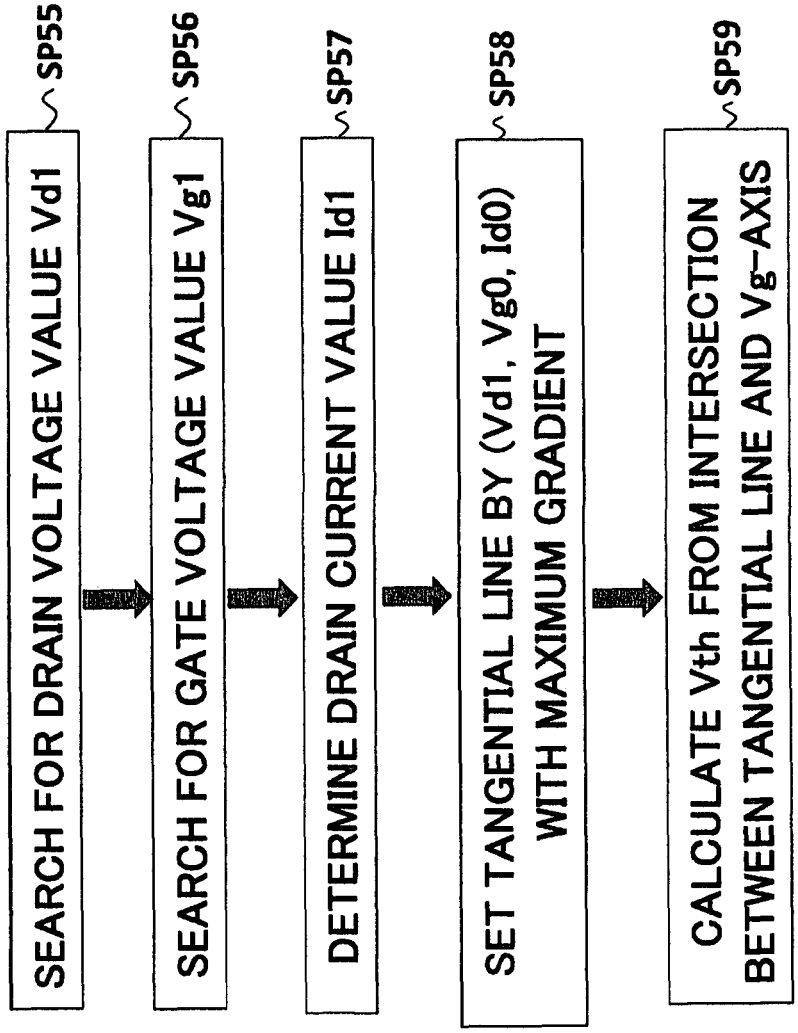
FIG. 5B is a diagram illustrating a process of extracting a threshold value Vth.

Next, the computer aided design equipment extracts the transistor characteristic values selected in SP1 from the transistor characteristic information acquired by the simulation unit 12 (SP5). FIGS. 5A and 5B show examples of the processes of obtaining the transistor characteristic values.

FIG. 5A is a flowchart showing a process of obtaining the drain current in regard to the drain voltage Vd1 when the gate voltage is fixed to a predetermined value. In this process, at first, the computer aided design equipment searches the simulation result for the combination containing the gate voltage that takes a predetermined value Vg1. To be more specific, the computer aided design equipment obtains the combinations (Vg1(+ΔVg), Vdi, Idi, where i=1, . . . , N) in which a deviation of the gate voltage Vg from the predetermined value Vg1 is equal to or smaller than an allowable value ΔVg among the combinations of Vgi, Vdi, Idi, where i is the integer (SP51). Hereinafter, a value "V-type(+ΔV)" is simply abbreviated as "V-type" where "-type" is, for example, "d", "g", etc.

Next, the computer aided design equipment searches the combinations of Vg1, Vdi, Idi, where i=1, . . . , N obtained in SP51 for the combinations containing the drain voltage Vd that takes the predetermined value Vd1 (SP52). More specifically, the computer aided design equipment obtains, from the combinations given above, the combination (Vg1, Vd1, Id1) in which a deviation of the drain voltage Vd from the predetermined value Vd1 is equal to or smaller than an allowable value ΔVd. If a plurality of such combinations is searched for, the combination containing the drain voltage Vd closest to Vd1 is selected.

Then, the drain current value Id1 is determined from the obtained combination (Vg1, Vd1, Id1) (SP53).

FIG. 5B is the flowchart showing a process of extracting the threshold value Vth. Herein, the computer aided design equipment, to start with, searches for the combinations (Vgi, Vdi, Idi, where i=1, . . . , M) in which the drain voltage Vd takes the predetermined value Vd1 (SP55).

Next, the computer aided design equipment searches for the combination (Vg1, Vd1, Id1) containing the gate voltage Vg taking the predetermined value Vg1 (SP56). Then, the computer aided design equipment determines the drain current Id (SP57). Further, the computer aided design equipment obtains the combination (Vg2, Vd1, Id2) of the gate voltage Vg2 in which Vg1 is changed by a micro quantity with the same drain voltage Vd1. Through this operation, the computer aided design equipment acquires a gradient a of the tangential line such as a=(Id2−Id1)/(Vg2−Vg1). This operation is executed for a variety of gate voltages Vg, thereby searching for Vg0 and Id0 with the maximum value of the gradient of the tangential line. Then, the computer aided design equipment sets an equation of the tangential line at a point (Vg0, Id0) such as Id−Id0=a·(Vg−Vg0) (SP58). Subsequently, the computer aided design equipment obtains the threshold value Vth from the value of Vg at the point where the tangential line intersects the Vg-axis by setting Id=0 (SP59).

The computer aided design equipment generates, based on the procedures described above, a table in which the plurality of transistor characteristic values is associated with the combination of the simulation parameters (SP6).

Next in SP7, the multiple linear regression analysis is conducted based on this table, and the plurality of transistor characteristic values is modeled by the polynomial expression corresponding to a second mapping relationship, where the plural simulation parameters are the variables. For instance, the threshold value Vth defined as the transistor characteristic value can be expressed by use of four simulation parameters such as Vth0, VSAT, U0, Lg in the following formula 1. Herein, the computer aided design equipment executes the procedure of the multiple linear regression analysis, and determines such coefficients a, ai (i is the integer) that the value in the formula 1 fits most to the table value of the characteristic value obtained by the simulation.

$$Vth = a + a0*Vth0 + a1*VSAT + a2*U0 + \\ a3*Lg + a4*Vth0*Vth0 + a5*VSAT*VSAT + \\ a6*U0*U0 + a7*Lg*Lg + a8*Vth0*VSAT + \\ a9*Vth0*U0 + a10*Vth0*Lg + \\ a11*VSAT*U0 + a12*VSAT*Lg + a13*U0*Lg$$ (Formula 1)

Further, the drain current Ids can be similarly expressed by use of Vth0, VSAT, U0, Lg in the following formula 2.

$$Ids = b + b0*Vth0 + b1*VSAT + b2*U0 + \\ b3*Lg + b4*Vth0*Vth0 + b5*VSAT*VSAT + \\ b6*U0*U0 + b7*Lg*Lg + b8*Vth0*VSAT + \\ b9*Vth0*U0 + b10*Vth0*Lg + \\ b11*VSAT*U0 + b12*VSAT*Lg + b13*U0*Lg$$ (Formula 2)

The operation is the same with Idsr1, Idsr2, Idst. Furthermore, other characteristic values such as the mutual conductance, the drain voltage dependency Δth of the threshold value and the floating body effect are designated as the transistor characteristics, in which case the values of coefficient of each formula for the characteristic value given above can be similarly obtained.

In next step SP8, the simulation parameters Vth0, VSAT, U0, Lg are described in the polynomial expression, in which Ids, Idsr1, Idsr2, Idst, Vth defined as the transistor characteristic values are the variables. Namely, the polynomial expression of the simulation parameters obtained in SP7 is transformed into the polynomial expression of the transistor characteristic values. At this time, if the number of the simulation parameters is the same as the number of the transistor characteristic values, the polynomial expression of the simulation parameters can be transformed into the polynomial expression corresponding to a first mapping relationship of the transistor characteristic values by solving the simultaneous equation.

Further, for example, the multiple linear regression analysis is performed by using again the table generated in SP6, and the respective simulation parameters may be modeled by the polynomial expression of the plurality of transistor characteristic values. Moreover, if a bias exists in the combination of Ids, Idsr1, Idsr2, Idst, Vth, etc in the table generated in SP6, the transistor characteristic values based on the combination of the simulation parameters may be calculated newly by use of the polynomial expression employed for the modeling in SP7. Then, the multiple linear regression analysis is carried out by adding the results of these operations, and the simulation parameters may be modeled with the plurality of transistor characteristic values. For example, the simulation parameter Vth0 can be expressed in the following formula 3 by employing the five transistor characteristic values such as Ids, Idsr1, Idsr2, Idst, Vth.

$$Vth0 = \\ d + d0*Ids + d1*Idsr1 + d2*Idsr2 + d3*Idst + d4*Vth + \\ d5*Ids*Ids + d6*Idsr1*Idsr1 + d7*Idsr2*Idsr2 +$$ (Formula 3)

-continued $$d8*Idst*Idst + d9*Vth*Vth + d10*Ids*Idsr1 +$$
$$d11*Ids*Idsr2 + d12*Ids*Idst + d13*Ids*Vth +$$
$$d14Idsr1*Idsr2 + d15Idsr1*Idst + d16*Idsr1*Vth +$$
$$d17Idsr2*Idst + d18*Idsr2*Vth + d19*Idst*Vth$$

Moreover, the mobility U0 can be expressed similarly to Vth0 in the following formula 4 by using Ids, Idsr1, Idsr2, Idst, Vth.

$$U0 = \quad \text{(Formula 4)}$$
$$e + d0*Ids + e1*Idsr1 + e2*Idsr2 + e3*Idst + d4*Vth +$$
$$e5*Ids*Ids + e6*Idsr1*Idsr1 + e7*Idsr2*Idsr2 +$$
$$e8*Idst*Idst + e9*Vth*Vth + e10*Ids*Idsr1 +$$
$$e11*Ids*Idsr2 + e12*Ids*Idst + e13*Ids*Vth +$$
$$e14Idsr1*Idsr2 + e15Idsr1*Idst + e16*Idsr1*Vth +$$
$$e17Idsr2*Idst + e18*Idsr2*Vth + e19*Idst*Vth$$

If other parameters, e.g., the gate width W, the gate length L, the under-the-gate penetrating diffusion length and the floating body effect are selected as the simulation parameters, the procedure of the multiple linear regression analysis remains unchanged. The steps described above enable the simulation parameters to be modeled with the transistor characteristic values In the process of SP7, the plurality of transistor characteristic values is modeled by the polynomial expression of the plurality of simulation parameters. As a substitute for the polynomial expression, the relationship between the simulation parameters and the transistor characteristic values can be also expressed by a weighted sigmoid function based on a neurolearning analysis. The neurolearning is that plural elements called neurons are combined to organize a mapping relationship to output signals from input signals. In the mapping relationship in this case, the output signal is generated by a non-linear function to which each input signal is weight-added. The sigmoid function is used as the non-linear function in this case.

The neurolearning analysis involves connecting, e.g., the combination of the transistor characteristic values to an input of a neural network. Then, the combination of the simulation parameter values is set as a teaching signal. The teacher signal connotes a signal that is desirable as the output signal in the neural network. Then, a weight for the weight-addition is determined so as to minimize a squared error between the output signal and the teacher signal in the neural network. A procedure of determining this weight is called the neurolearning. In the neurolearning, normally, a weight coefficient is determined in a direction tracing back to the input side from the output side. For example, Japanese Patent Application No. 3110434 proposes an example of the neurolearning and an example of a circuit for realizing the network thereof.

In this example, the neural network when the input signal is organized by the combination of the transistor characteristic values corresponds to the first mapping relationship. Further, the neural network when the input signal is organized by the combination of the simulation parameters corresponds to the second mapping relationship.

In the first embodiment discussed above, as illustrated in FIG. 4, at first, in the process of SP7, the transistor characteristic values are modeled with the simulation parameters, and, thereafter, the simulation parameters are modeled with the transistor characteristic values by the inverse transform in SP8 (FIG. 4). As a substitute for this process, however, the simulation parameters may also be immediately modeled with the transistor characteristic values by use of the result of the simulation in SP6. The mapping relationship acquired at this time corresponds to the first mapping relationship. A procedure thereof is the same as SP7 (FIG. 4).

A second embodiment will be described with reference to the FIGS. 6 and 7. The first embodiment discussed above has exemplified the computer aided design equipment that acquires, when given the circuit component characteristics such as the transistor characteristic information, the mapping relationship for obtaining the simulation parameters. The second embodiment will exemplify the computer aided design equipment that adds, when further given the layout information of the circuit components or the net list, a process of modeling the characteristics from the layout information of the circuit components or from the net list. The second embodiment will further exemplify the computer aided design equipment that acquires, if the characteristics of the circuit components, e.g., the layout information or the variables contained in the net list can be described by the polynomial expression, immediately the simulation parameters from the layout information or the net list by applying the polynomial expression and the mapping exemplified in the first embodiment. Still further, the second embodiment will exemplify procedures of executing the simulation based on the simulation parameters, then finally designing the circuit including the electronic components, and thus manufacturing an electronic device.

Figure 6:
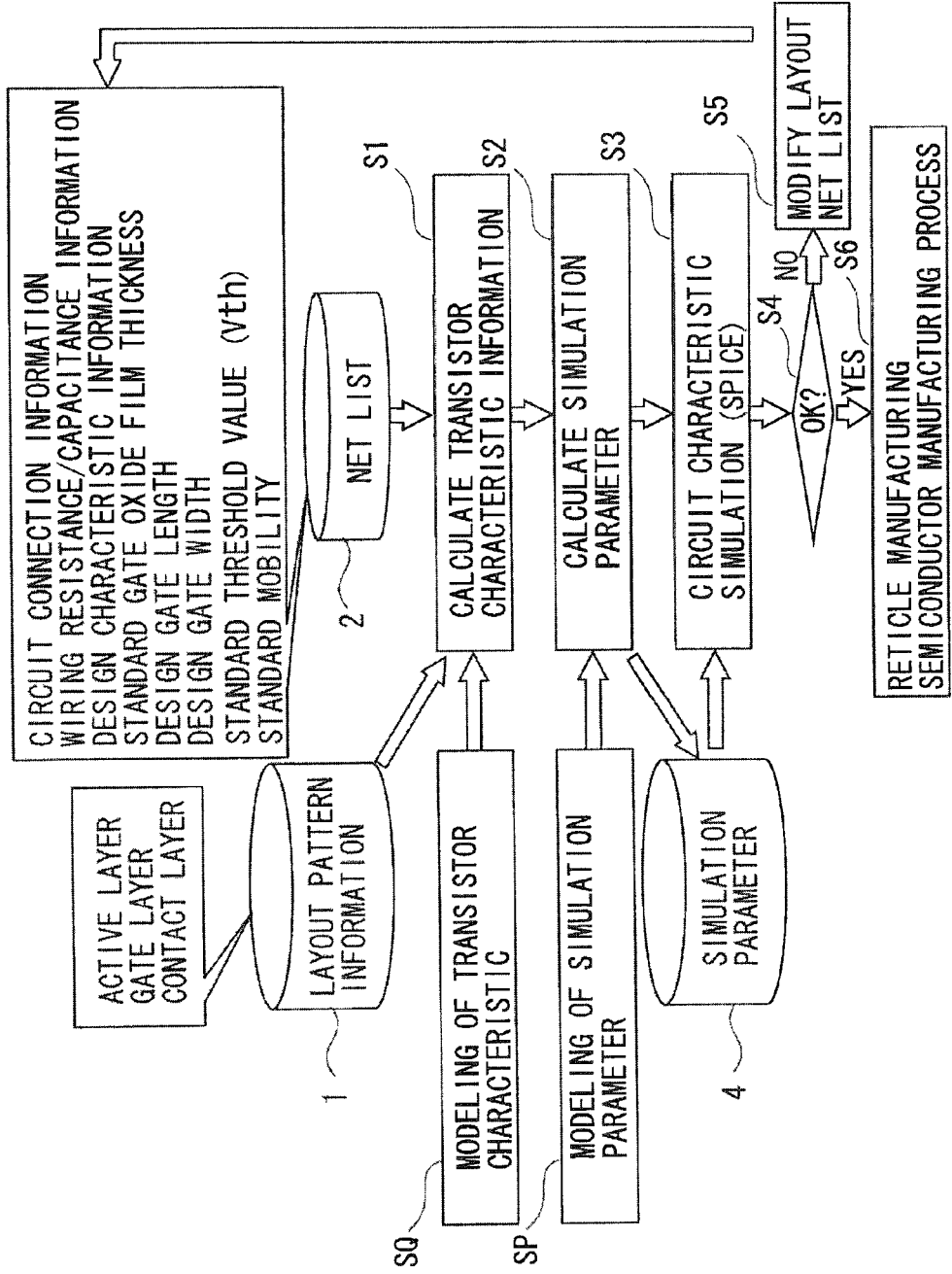
FIG. 6 is an explanatory diagram of an outline of processes of an electronic device manufacturing method.

FIG. 6 is an explanatory diagram illustrating an outline of processes of an electronic device manufacturing method utilizing the computer aided design equipment. The computer aided design equipment extracts the transistor characteristic information from layout pattern information 1 of the transistors and a net list 2 (S1). Herein, the layout pattern information 1 of the transistors contains pieces of information on pattern shapes for defining the individual elements such as the active layer, the gate layer and the contact layer. Further, the net list 2 contains mainly circuit connecting information used for connecting the element to the element. Moreover, the net list 2 contains wiring resistance information, capacitance information and design characteristic information. The layout pattern information 1 and the net list 2 correspond to the layout information.

Among these items of information, the design characteristic information contains, e.g., a standard gate oxide film thickness, a design gate length, a design gate width, a standard threshold voltage (Vth), a standard mobility, etc which will hereinafter be simply termed standard values. Herein, the standard gate oxide film thickness, the design gate length, the design gate width, etc are the values that should be said to be target values (design values) at a design stage. A semiconductor manufacturing process has a difficulty of forming patterns on a semiconductor substrate as specified by the design values, and there is a case of having discrepancies from the values generated in the actual semiconductor process. On the other hand, when the circuit is produced according to the design values, the terminology involves using an actual gate length and an actual gate width in the sense of dimensional values generated actually on the semiconductor substrate.

Then, the acquisition of a result of the precise simulation requires not the simple simulation in a way that directly reflects the design characteristic information but consideration of influence of the actual manufacturing process.

Such being the case, in a transistor characteristic information extracting process (S1) in FIG. 6, the layout pattern information 1 and the net list 2 are converted into the transistor characteristic values of the transistors that are actually manufactured.

In this case, in the second embodiment, a relationship between the parameters contained in the layout pattern information 1 and in the net list 2 and the transistor characteristic values based on the manufacturing result, is acquired beforehand by modeling. This relationship corresponds to a third mapping relationship. The modeling is executed offline separately from the design process and the manufacturing process (SQ).

The modeling process may be done based on the multiple linear regression analysis. Namely, plural combinations of the design characteristic information, e.g., the plural combinations of the standard gate oxide film thickness, a design gate pitch, the design gate length, the design gate width, the standard threshold value, the standard mobility, etc, are generated, and the characteristic information (Ids, Vth, etc) of the transistor manufactured based on these items of design characteristic information is empirically measured. Then, the transistor characteristic values (Ids, Vth, etc) are modeled by the polynomial expression, in which the variables are the elements organizing the combination of the design characteristic information (the transistor characteristic information such as the standard gate oxide film thickness, the design gate pitch, the design gate length, the design gate width, the standard threshold value and the standard mobility).

Further, the simulation parameters are modeled by the polynomial expression of the transistor characteristic values in the procedures explained in the first embodiment (SP). The thus-modeled relationship corresponds to the first mapping relationship. Then, the polynomial expression of the design characteristic information (the standard gate oxide film thickness, the design gate pitch, the design gate length, the design gate width, the standard threshold value, the standard mobility, etc) obtained in SQ or a calculated value acquired by substituting the design characteristic information into this polynomial expression obtained in SQ, is further substituted into the polynomial expression of the transistor characteristic values obtained in SP.

More specifically, the transistor characteristic values obtained in S1 are substituted into the polynomial expression in S2 (S2). Simulation parameters 4 are thereby obtained from the design characteristic information. A relationship with which the simulation parameters 4 are obtained from the design characteristic information corresponds to a fourth mapping relationship.

Then, the computer aided design equipment executes the circuit characteristic simulation by use of the simulation parameters 4 (S3). The circuit characteristic simulation enables the acquisition of the characteristics of the circuit constructed by connecting the plurality of circuit components of the transistor etc. Herein, the characteristics of the circuit represent, e.g., power consumption, a delay time, etc of the circuit.

Then, the computer aided design equipment, as a result of the circuit characteristic simulation, determines whether the circuit characteristics reach the target criteria or not (S4). Subsequently, if unable to attain the target standard values, the computer aided design equipment prompts the user to change the layout pattern information 1 or the net list 2. The user changes, based on a change-prompting message, the layout pattern information 1 or the net list 2 (S5).

For example, if the delay time is larger than a target value, the design gate width of any one of the transistors is expanded in order to attain high-speed driving. Alternatively, the design gate length may be reduced. While on the other hand, if the power consumption is larger than a predetermined target value, the design gate width is reduced. Then, in response to an instruction given from the user, the computer aided design equipment repeats the processes in S1 through S4.

Whereas if it proves from the determination in S4 that the target standard values are attained, further in response to the user's operation, the computer aided design equipment further advances the layout computer aided design. As a result, pieces of layout data of each of the layers for manufacturing a reticle are generated. Then, the reticle is manufactured, the semiconductor manufacturing process is executed, and the electronic device is manufactured (S6). Herein, the semiconductor manufacturing process includes the film formation, oxidation, the photolithography, developing, etching, implantation of an impurity, a thermal treatment, etc. This type of manufacturing process enables the semiconductor circuit having the target circuit characteristics to be manufactured.

Thus, if the transistor characteristic values are modeled by the parameters contained in the layout pattern information 1 and in the net list 2, the transistor characteristic values expressed by the model formula thereof are substituted into the polynomial expression for extracting the simulation parameters which will hereinafter be also referred to as an extraction formula described in the first embodiment, whereby the data in the layout pattern information 1 and in the net list 2 can be converted into the simulation parameters. Then, it is feasible to predict with high accuracy the circuit characteristics such as the delay time of the circuit including the plurality of transistors depending on the layout.

Figure 7:
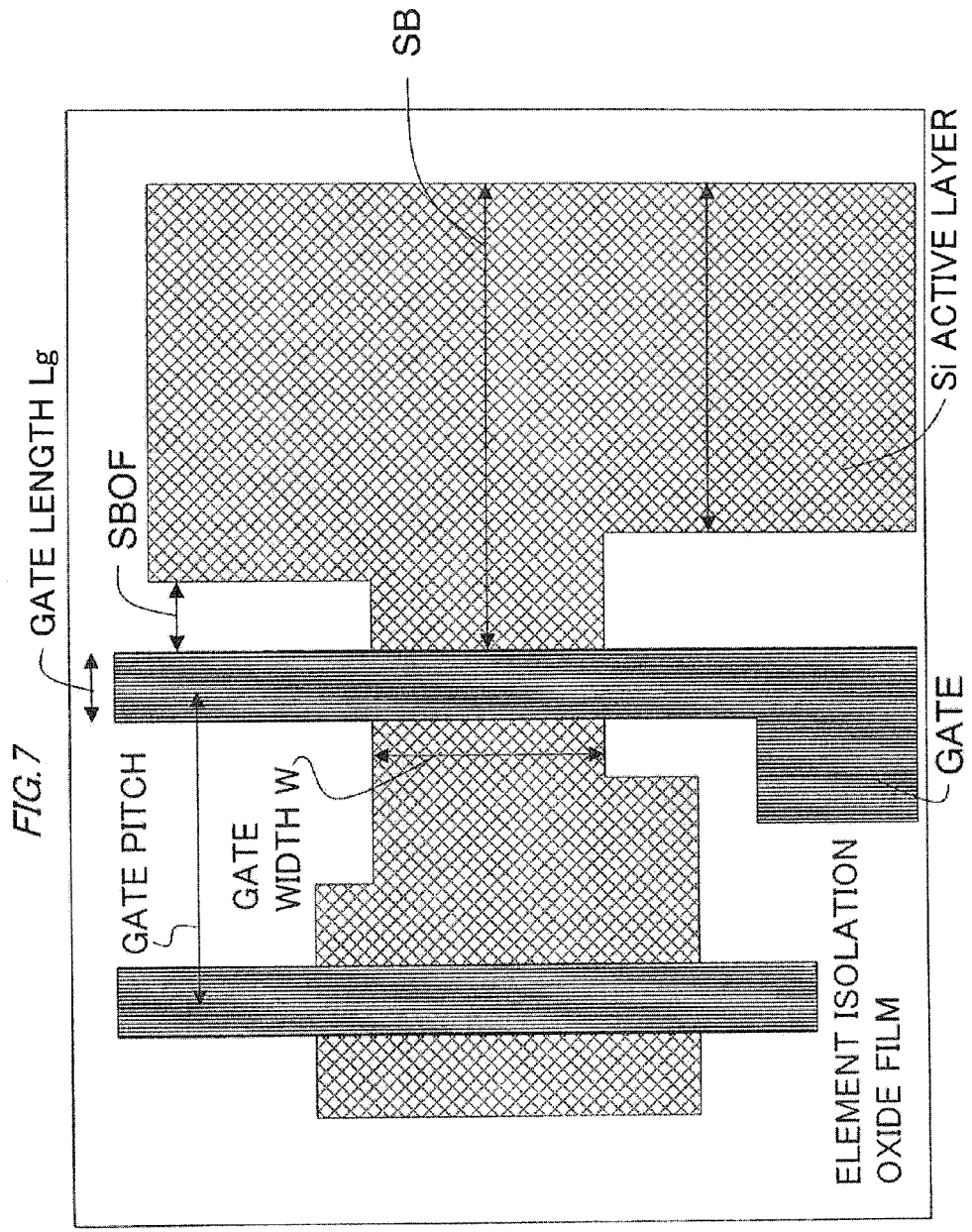
FIG. 7 is an explanatory diagram illustrating examples of layout pattern information 1 and a net list 2 by use of layout data.

Namely, with respect to layout data and a pattern layout which is a specific example of the layout pattern information 1, as illustrated in FIG. 7, the transistor characteristic values are expressed as below.

For example, the threshold voltage Vth and the drain current Ids are modeled by the polynomial expression of a gate pitch p, the gate length Lg, a source/drain width SB for example, a width of the source region, or a width of the drain region, a source/drain Shallow Trench Isolation (STI) offset SBOF, for example, an offset distance from the region of the element isolation film in the source region, or an offset distance from the region of the element isolation film in the drain region, etc of the transistor, and are then described in the following formulae 5 and 6. Note that the gate pitch p, the gate length Lg, etc are given by way of a specific example of the information in the net list 2.

$$Vth = c + c0*p + c1*Lg + c2*W + c3*SB + c4*SA + \\ c5*SBOF + c6*p*Lg + c7*p*W + c8*p*SB + \\ c9*p*SA + c10*p*SBOF + c11*Lg*W + \\ c12*Lg*SB + c13*Lg*SA + c14*Lg*SBOF + \\ c15*W*SB + c16*W*SA + c17*W*SBOF + \\ c18*SB*SA + c19*SB*SBOF + c20*SA*SBOF$$ [Formula 5]

$$Ids = d + d0*p + d1*Lg + d2*W + d3*SB + d4*SA + \\ d5*SBOF + d6*p*Lg + d7*p*W + d8*p*SB + \\ d9*p*SA + d10*p*SBOF + d11*Lg*W + \\ d12*Lg*SB + d13*Lg*SA + d14*Lg*SBOF + \\ d15*W*SB + d16*W*SA + d17*W*SBOF + \\ d18*SB*SA + d19*SB*SBOF + d20*SA*SBOF$$ [Formula 6]

Namely, the characteristics of the transistor manufactured based on the layout pattern information 1 and the net list 2 shown in FIG. 7 may be actually measured in accordance with the procedures explained in FIG. 6. Then, with respect to the multiplicity of combinations of the parameters, for example, the gate pitch p, the gate length Lg, the source/drain width SB, the source/drain STI offset SBOF, etc in the net list 2, the threshold voltage Vth, the drain current Ids, etc of the transistor may be actually measured. Then, a relationship between the threshold voltage Vth, the drain current Ids, etc and the combination of the parameters in the net list 2 is subjected to the multiple linear regression analysis, and the coefficient of the polynomial expression as in the formulae 5 and 6 may be determined.

Accordingly, as in the formulae 5 and 6, when the transistor characteristic values are modeled by the polynomial expression of the parameters contained in the layout pattern information 1 or the net list 2, these formulae may be substituted directly into the polynomial expressions of the transistor characteristic values such as the formulae 3, 4, etc. With this operation, it is possible to acquire the mapping to the simulation parameters from the parameters contained in the layout pattern information 1 or the net list 2.

According to the second embodiment, when the layout pattern information 1 or the net list 2 is determined, the simulation parameters can be immediately obtained. It is therefore feasible to check the operation of the circuit including the plurality of circuit components defined by the layout pattern information 1 or the net list 2. Then, if the circuit operation satisfies the predetermined criteria, the design further proceeds, and it is possible to manufacture the reticle and the electronic device based on the semiconductor manufacturing process.

If the process-dependent transistor characteristic values are modeled with the process parameters, the process-dependent transistor characteristics can be converted into the simulation parameters by substituting the transistor characteristic values expressed in the model formula into the simulation parameter extraction formula described in the first embodiment. In this case, a mapping relationship for converting the combination of the process parameters into the transistor characteristic values corresponds to a fifth mapping relationship. Further, a mapping relationship for converting the combination of the process parameters into the simulation parameters corresponds to a sixth mapping relationship. With this contrivance, the circuit characteristics such as the delay time due to a slight change in the process can be predicted with the high accuracy. The following are examples of the polynomial expressions corresponding to the fifth mapping relationship.

$$Vth = \quad \text{(Formula 7)}$$
$$f + f0*DOSE(a) + f1*ENERGY(a) + f2*DOSE(b) +$$
$$f3*ENERGY(b) + f4*DOSE(a)*ENERGY(a) +$$
$$f5*DOSE(a)*DOSE(b) +$$
$$f6*DOSE(a)*ENERGY(b) +$$
$$f7*ENERGY(a)*DOSE(b) +$$
$$f8*ENERGY(a)*ENERGY(b) +$$
$$f9*DOSE(b)*ENERGY(b)$$

-continued
$$Ids = \quad \text{(Formula 8)}$$
$$g + g0*DOSE(a) + g1*ENERGY(a) + g2*DOSE(b) +$$
$$g3*ENERGY(b) + g4*DOSE(a)*ENERGY(a) +$$
$$g5*DOSE(a)*DOSE(b) +$$
$$g6*DOSE(a)*ENERGY(b) +$$
$$g7*ENERGY(a)*DOSE(b) +$$
$$g8*ENERGY(a)*ENERGY(b) +$$
$$g9*DOSE(b)*ENERGY(b)$$

where DOSE(a) is a channel impurity implantation quantity, ENERGY(a) is a channel impurity implantation energy, DOSE(b) is a halo (pocket) impurity implantation quantity, and ENERGY(b) is a halo (pocket) impurity implantation energy. Herein, the term "pocket" connotes an impurity region that forms part of the channel into which the impurity is implanted with a gate and a sidewall serving as a mask.

Note that in the examples of the formulae 7 and 8, the transistor characteristic values depending on the layout pattern information 1 and the net list 2 are fixed. Namely, herein, the layout pattern information 1 and the net list 2 is kept in the fixed status, and then the analysis in the case where the process change is made is executed.

The first embodiment has exemplified the computer aided design equipment that models the simulation parameters with the transistor characteristic values directly from the simulation result. Further, the second embodiment has exemplified the computer aided design equipment that acquires the simulation parameters from the layout information of the circuit components or from the net list. Still further, the third embodiment has exemplified the computer aided design equipment that converts the process-dependent transistor characteristics into the simulation parameters.

The fourth embodiment will exemplify the computer aided design equipment that obtains such simulation parameters with much higher accuracy. Other configurations and operations are the same as those in the first through third embodiments. This being the case, the components, which are the same as those in the first through the third embodiments, are marked with the same symbols and numerals, and their explanations are omitted. Further, the drawings in FIGS. 1 through 7 will be referred to when the necessity arises.

The implementation of the circuit simulation by using the transistor characteristics modeled by the computer aided design equipment exemplified in the first through third embodiments, entails replacing the differences of the transistor characteristics with the simulation parameters employed in the circuit simulation. In these embodiments, the simulation parameter extracting method is illustrated by which the simulation parameters are modeled with the transistor characteristic values on the basis of the circuit simulation. This method might, however, cause a case of relatively lacking in the precision for the following reasons.

Figure 8:
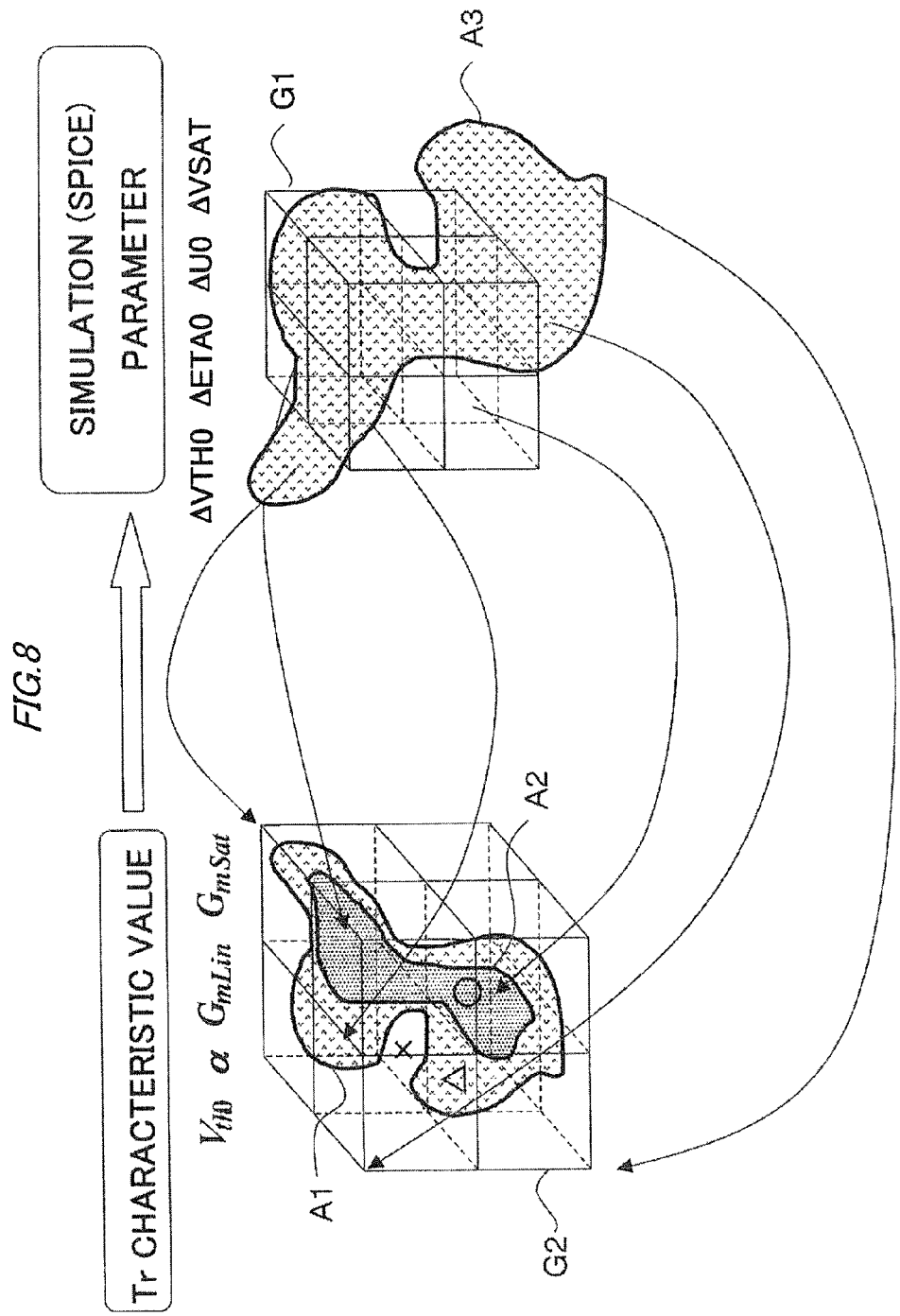
FIG. 8 is a diagram illustrating a bias of a transistor characteristic value obtained from circuit simulation.

FIG. 8 shows a bias in the transistor characteristic value acquired from the circuit simulation. FIG. 8 illustrates a relationship between the transistor characteristic values obtained by the simulation using the combination of the plural simulation parameters based on the experimental design and the simulation parameters at this time. To begin with, as for the simulation parameters selected when executing the simulation, the data has no bias because of being based on the experimental design (a grid G1 on the right side conceptually represents the combination of the simulation parameters selected when executing the simulation).

The bias might, however, occur in the combination of the transistor characteristics acquired from the simulation. The reason for this occurrence is that the simulation parameter and the transistor characteristic value do not necessarily have a relationship of the linear function. A concept of the data (a transistor characteristic distribution) in which curved surfaces are acquired by the simulation is illustrated on the left side in FIG. 8. Now, a hypothesis is that on the left side in FIG. 8, a thick mesh area (a symbol A2) has a great number of samples of the data, a thin mesh area (a symbol A1) has a small number of samples of the data, and a peripheral area has none of the data. Based on this hypothesis, in the case of modeling (approximation of the polynomial expression) the simulation parameters with the transistor characteristic values in a way that makes the multiple linear regression analysis about the transistor characteristic values obtained from the simulation based on the combination of the plural simulation parameters by using the simulation parameters hitherto given, for example, the data does not exist in the area in the vicinity of a position depicted by x, and hence the simulation parameters extracted by use of the transistor characteristic values in this area are far from an acceptable level in terms of the accuracy.

Moreover, in many cases, even when the circuit simulation is performed by employing the parameters in the area containing an insufficient data count (insufficient number of data samples), the target transistor characteristic values are not attained. Further, the area A1 depicted by Δ has the small data count and therefore has a large regression error. This is because the multiple linear regression analysis involves determining the polynomial expression so as to fit most to, generally, the data to be modeled, and hence it is impossible to acquire, if the data itself to be modeled has a small data count, the model based on the highly accurate analyzed result, i.e., the highly accurate polynomial expression.

Besides, such a problem arises that it can not be determined which area, the area x or the area Δ, the transistor characteristic values (the extracted simulation parameters) to be finally applied are mainly affected by.

Such being the case, the fourth embodiment provides a technology of converting changes caused by the differences of the layout data of the transistor characteristics, the pattern layout and the manufacturing process into the parameters used in the circuit simulation with the high accuracy.

Figure 9:
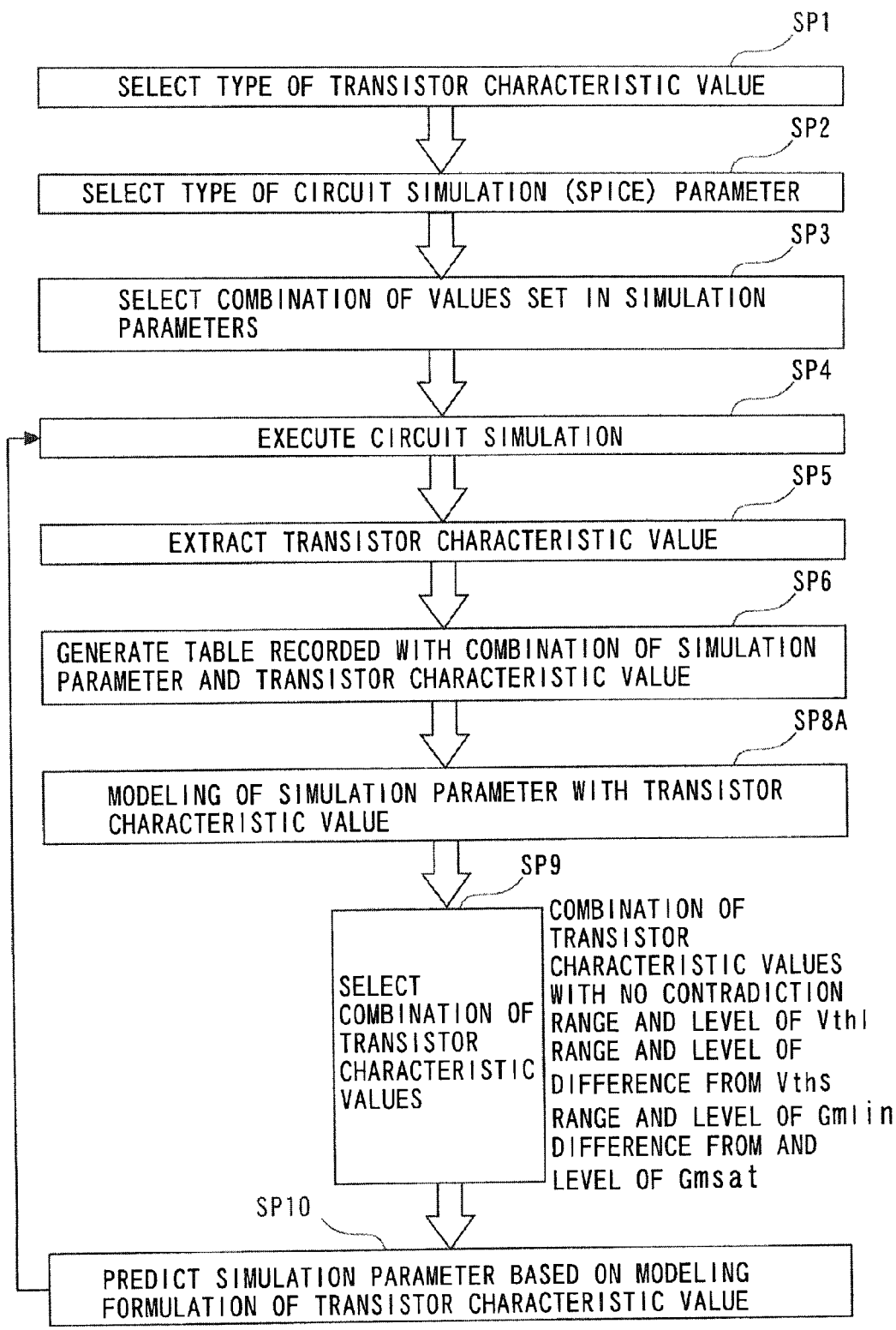
FIG. 9 is a flowchart illustrating a process of the computer aided design equipment according to a fourth embodiment.

FIG. 9 is a flowchart showing processes of the computer aided design equipment according to the fourth embodiment. In these processes, the processes in SP1-SP6 are the same as those in FIG. 4, which have been explained in the cases of the first through third embodiments. Namely, the multiple linear regression analysis is carried out based on the table generated in the process in SP6, and the plurality of simulation parameters is modeled by the polynomial expression of the plurality of transistor characteristic values (SP8A). Concerning the modeling, as done in SP7 and SP8 in FIG. 4, the transistor characteristic values are temporarily modeled as the polynomial expression of the simulation parameters and may be inversely transformed. Further, as in the modified example 2 of the first embodiment, without the inverse transform, the simulation parameters may be modeled by the polynomial expression of the transistor characteristic values.

Next, the computer aided design equipment predicts beforehand a fluctuation range of the actual transistor characteristics, then determines a range of the maximum value through the minimum value of the characteristic values and the number of levels thereof, and further determines, based on the determined elements, the combination of the plural transistor characteristic values (SP9). In this case, basically, the transistor characteristic values may be equally allocated within the range of the maximum value through the minimum value. The phrase "equally allocated" connotes "obtaining points for dividing the range of the maximum value through the minimum value at equal intervals or intervals approximate to the equal intervals". The CPU of the computer aided design equipment, which executes the process in SP9, corresponds to a characteristic value setting unit.

Herein, a further available process is a process of constraining the conditions so as not to cause any contradiction in a magnitude relationship between the determined combinations of the transistor characteristic values. For example, a threshold value (Vthl) in the linear region of the transistor characteristics is always larger than a threshold value (Vths) in the saturation region. Therefore, a difference (dVthl) of the threshold value (Vthl) in the linear region from the threshold value (Vths) in the saturation region is defined, and the combination with no contradiction can be determined by calculating the threshold value (Vthl) in the linear region in a way that uses a combination of the threshold value (Vths) in the saturation region and the difference (dVthl, a non-negative value). Moreover, the mutual conductance (Gmlin) in the linear region of the transistor characteristics invariably takes a value smaller than the mutual conductance (Gmsat) in the saturation region. Hence, a ratio (αGmlin, "1" or larger) of the mutual conductance (Gmsat) in the saturation region to the mutual conductance (Gmlin) in the linear region is defined, and the mutual conductance (Gmsat) in the saturation region is calculated by use of a combination of the mutual conductance (Gmlin) in the linear region and the ratio (αGmlin), thereby enabling the combination with no contradiction to be determined. Further, if no contradiction exists in the magnitude relationship between the combinations of the transistor characteristic values, a plurality of current values in the predetermined voltage or a plurality of voltage values in the predetermined current can be used as the transistor characteristics.

Accordingly, when setting the combination of the characteristic values to (Vthl, Vths, Gmlin, Gmsat), these values can be described as follows:

$$Vthl = Vths + dVthl,$$

where dVthl>=0;

$$Gmsat = \alpha Gmlin * Gmlin,$$

where αGmlin>=1.
Namely, the combination of the characteristic values may be calculated such as (Vths+dVthl, Vths, Gmlin, αGmlin*Gmlin). Then, the value may be selected within the range of dVthl>=0. Moreover, the value may also be selected within the range of αGmlin>=1.

Next, the simulation parameters are predicted based on the model generated in SP8A (SP10). Specifically, the combination of the transistor characteristic values acquired in SP9 is substituted into the polynomial expression of the transistor characteristic values acquired in SP8, thereby obtaining the values of the simulation parameters (the combination of the simulation parameters, corresponding to the combination of the transistor characteristic values) (SP10). The CPU of the computer aided design equipment, which executes the process in SP10, corresponds to a simulation parameter acquiring unit.

The then-predicted combination of the simulation parameters takes, conceptually, for example, as illustrated in an area A3 on the right side in FIG. 8, a shape that is more distorted than the initially-set combination (the grid G1) of the simulation parameters.

Further, the computer aided design equipment again executes the process in SP4 on the basis of the combination of the simulation parameters, which is predicted in SP10. The CPU of the computer aided design equipment, which executes a loop of processing from SP10 back to SP4, corresponds to a control unit. Namely, the CPU executes the circuit simulation for every combination of the simulation parameters acquired in SP10. This operation enables generation of a table containing the transistor characteristic values in which the bias in the transistor characteristic is reduced. The accuracy of the table generated in SP8A can be enhanced by repeating this loop of processing once or more.

Figure 10:
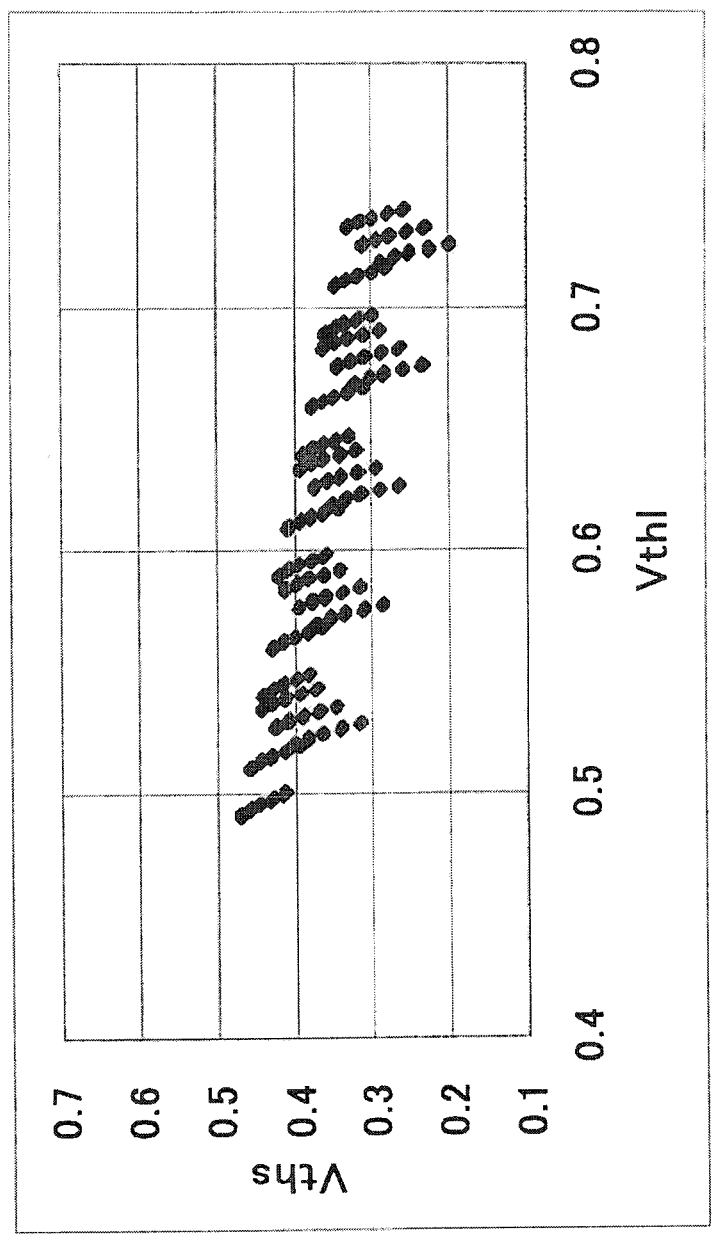
FIG. 10 is a diagram illustrating a relationship between Vthl and Vths in the case of conducting SPICE-based simulation with simulation parameters by obtaining the simulation parameters in a way that sets the transistor characteristic values scattered equally.

FIG. 10 illustrates a relationship between Vthl and Vths in the case of obtaining the simulation parameters in the way of equally setting the transistor characteristic values and conducting the SPICE-based simulation by use of these simulation parameters. To be specific, FIG. 10 shows a result of obtaining Vthl and Vths defined as the transistor parameters by executing once the control of looping the processing from SP9 back to SP4 in FIG. 9. In this case, owing to the equally-set transistor characteristic values, the simulation parameters become a distorted aggregation of the values as in the area A3 in FIG. 8.

Figure 11:
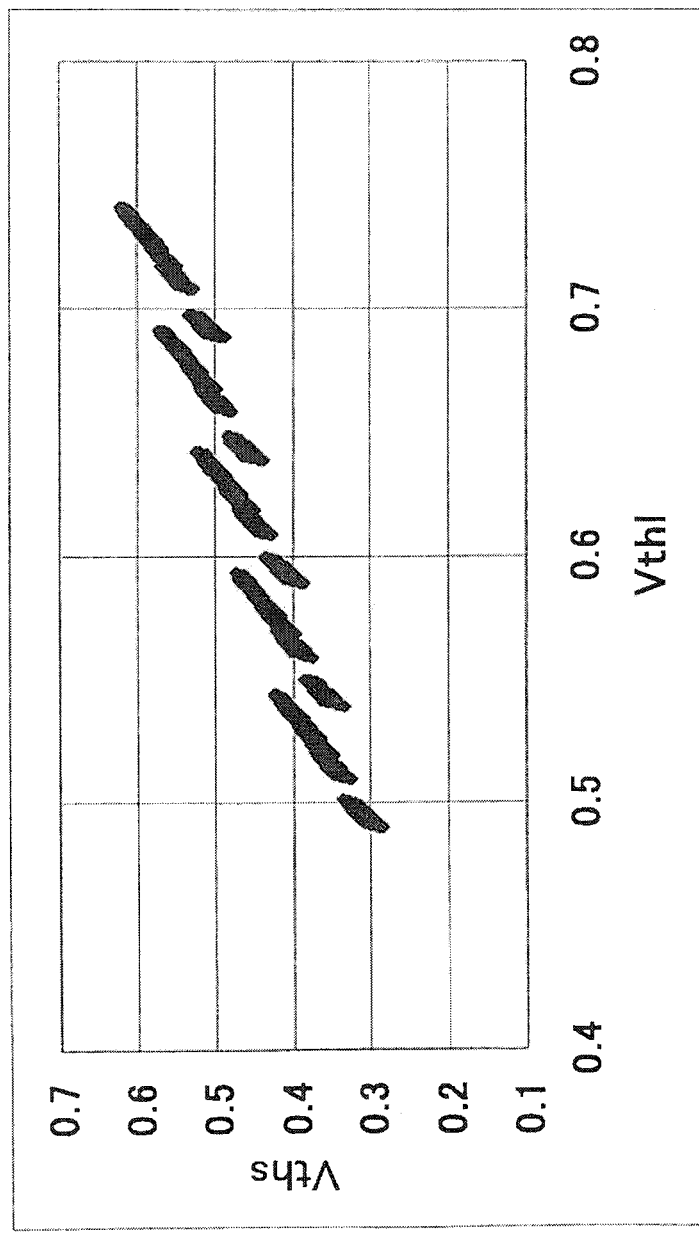
FIG. 11 is a diagram illustrating an example of a result of obtaining Vthl and Vths by the computer aided design equipment in a first embodiment.

Moreover, FIG. 11 shows an example of a result of obtaining Vthl and Vths by the computer aided design equipment according to the first embodiment. In this case, Vthl and Vths are acquired by equally setting the simulation parameters.

In FIG. 10, as compared with FIG. 11, the relationship between Vthl and Vths spreads over the area having a larger width. Namely, in the case of FIG. 11, in the data (the combination of Vthl and Vths), the values representing the correlation locally exist (distribute along right-ascending lines) in linearly narrow regions. By contrast, in the case of FIG. 10, the data develops in band-shaped regions each having a large width.

Generally, Vthl and Vths take the correlation, however, for example, in the case of changing the impurity in the channel region, there might be a case where the correlation between Vthl and Vths gets collapsed. According to the procedures in the first embodiment, there might also be a case in which the setting of the multiple simulation parameters including such a case is not necessarily sufficient. On the other hand, adoption of the procedures in the fourth embodiment illustrates that the multiple simulation parameters having none of such a correlation can be set.

As discussed above, the computer aided design equipment in the fourth embodiment obtains the transistor characteristic values SP1-SP5 in FIG. 9 from the result of the simulation with respect to the combination of the simulation parameters in the same way as in the first through third embodiments. In this case, as known by the experimental design, the combinations of the values may be selected as the simulation parameters at the equal intervals. Then, the simulation parameters are modeled by the polynomial expression in which the variables are the transistor characteristic values. At this time, only the result with the bias is obtained as the transistor characteristic values by the simulation in SP4 in FIG. 9 in many cases. Accordingly, in the area with the small quantity of data, there might occur such a case that the simulation parameters can not be modeled with the transistor characteristic values with the high accuracy, depending on the multiple linear regression analysis.

In the fourth embodiment, however, the combination of the transistor characteristic values is equally selected and substituted into the polynomial expression of the transistor characteristic values, thereby predicting the simulation parameters. The result of this prediction does not show, in many cases, the uniformity in a space of the simulation parameters (see an area A3 in FIG. 8). The simulation is again executed by use of the predicted simulation parameters, whereby it is possible to acquire the transistor characteristic values with the less bias than in the case of executing the simulation by using the equally allocated simulation parameters.

Moreover, the transistor characteristic values with a much smaller bias can be acquired by repeating the processes in SP9-SP4 in FIG. 9 plural number of times. As a result, the simulation parameters can be modeled with the transistor characteristic values with the even higher accuracy than by the processes of the computer aided design equipment without the loop of processing from SP9 back to SP4 in FIG. 9.

The computer aided design equipment according to the fourth embodiment is capable of converting the changes caused by the differences of the layout data of the transistor characteristics, the pattern layout and the manufacturing process into the parameters used in the circuit simulation with the high accuracy, and also capable of highly precisely predicting the circuit characteristics such as the delay time of the circuit including the plurality of layout dependent transistors. Further, the computer aided design equipment can predict the circuit characteristics such as the delay time due to the slight change in the process with the high accuracy.

The fourth embodiment has exemplified the computer aided design equipment that obtains again the simulation parameters by temporarily substituting the equally-distributed transistor characteristic values into the simulation parameters modeled with the transistor characteristic values, and repeats again the circuit simulation. In other words, the fourth embodiment has exemplified the computer aided design equipment that executes, as shown in FIG. 9, the loop of the processes of modeling the simulation parameters with the transistor characteristic values (SP8A), selecting the combination of the transistor characteristic values (SP9), predicting the simulation parameters (SP10) and executing the simulation (SP4).

A fifth embodiment will exemplify the computer aided design equipment that executes a process, in the processes according to the fourth embodiment, of repeating the processing loop described above and narrowing the transistor characteristic values down to a predetermined value. Other configurations and operations are the same as those in the fourth embodiment. This being the case, the components, which are the same as those in the fourth embodiment, are marked with the same symbols and numerals, and their explanations are omitted.

FIG. 12 is a flowchart showing a process of the computer aided design equipment according to the fifth embodiment. In this processing flow, the steps other than SP9A are the same as those in FIG. 9. In SP9A, the computer aided design equipment is given a central value and a range of a predetermined deviation from the central value as the transistor characteristic values and sets the combination of the transistor characteristic values. For instance, with respect to the threshold value Vthl in the linear region, there is set a combination of five values such as Vthl0−ΔVthl, Vthl0−ΔVthl/2, Vthl0, Vthl0+ΔVthl/2 and Vthl0+ΔVthl. Herein, ΔVthl is the deviation to be prescribed from the central value with respect to the threshold value Vthl in the linear region.

Moreover, with respect to the threshold value Vths in the saturation region, there is set a combination of five values such as Vths0−ΔVths, Vths0−ΔVths/2, Vths0, Vths0+ΔVths/2 and Vths0+ΔVths. Herein, ΔVths is the deviation to be prescribed from the central value with respect to the threshold value Vths in the saturation region.

Further, as for the mutual conductance Gmlin in the linear region, there is set a combination of five values such as Gmlin0/Δgml, Gmlin0/Δgml/2, Gmlin0, Gmlin0*Δgml/2 and Gmlin0*Δgml. Herein, Δgml is the deviation to be prescribed from the central value with respect to the mutual conductance Gmlin in the linear region.

Still further, in connection with the mutual conductance Gmsat in the saturation region, there is set a combination of five values such as Gmsat0/Δgms, Gmsat0/Δgms/2, Gmsat0, Gmsat0*Δgms/2 and Gmsat0*Δgms. Herein, Δgms is the deviation to be prescribed from the central value with respect to the mutual conductance Gmsat in the saturation region. Then, a combination of the values, which should be substituted into the combination of the variables (Vthl, Vths, Gmlin, Gmsat) of the transistor characteristic values, is generated by combining these values. At this time, the case of the fourth embodiment is similarly applied to the point of establishing the conditions such as Vthl>Vths and Gmsat>Gmlin. It should be noted that the number of these values is not limited to "5".

Then, predictive values of the plurality of simulation parameters are acquired by substituting the combination of those values into the model formula of the simulation parameters (SP10). Subsequently, the SPICE-based simulation is carried out by use of the predictive values of the simulation parameters (SP4). The subsequent procedures are the same as those in the fourth embodiment. The polynomial expression, which describes the model of the simulation parameters, gradually conforms to the combination of the transistor characteristic values given the central value and the range of the predetermined deviation from the central value by repeating these processes.

Accordingly, for example, if the semiconductor manufacturing process is changed, an average value, a mode or the central value, etc, which are obtained from the semiconductor manufacturing process in the present design data, may be set as the central value of the transistor characteristic values. Further, a fluctuations acquired in the step may be set as the predetermined deviation from the central value. Further, with this setting, it is possible to highly precisely acquire the central value of the simulation parameters corresponding to the typical transistor characteristic values in the specified manufacturing process. The semiconductor manufacturing process and the central value of the simulation parameters corresponding to the semiconductor manufacturing process are not frequently changed, and hence the simulation targeted at the specified semiconductor manufacturing process or the specified design data can be attained.

Note that in the explanation of SP9A, the predetermined deviation Δ from the central value is fixed. In place of these procedures, however, any inconvenience may not be caused by setting the deviation Δ so as to be decreased stepwise per loop of the processing. For example, in the first loop of the processing, the deviation Δ is set to a value (e.g., 2-fold value, a 10-fold value or a 100-fold value) larger than the manufacturing fluctuations in the specified semiconductor manufacturing process, and may be then set small (changed to a ½-fold value, a 1/10-fold value or 1/100-fold value) per loop of the processing.

Thus, the deviation Δ is set large for the first time and then decreased each time the operation loops the steps round, whereby the relationship between the central value of the simulation parameters and the central value of the transistor characteristic values can be precisely acquired, Namely, at the initial stage, the modeling is executed in the comparatively wide parameter range, and the range of the transistor characteristic values is narrowed down stepwise, thereby making it feasible to reduce a possibility of converging on a singular model.

A program for making a computer, other machines and devices which will hereinafter be referred to as the computer etc, realize any one of the functions can be recorded on a recording medium readable by the computer etc. Then, the computer etc is made to read and execute the program on this recording medium, whereby the function thereof can be provided.

Herein, the recording medium readable by the computer etc connotes a recording medium capable of storing information such as data and programs electrically, magnetically, optically, mechanically or by chemical action, which can be read from the computer etc. Among these recording mediums, for example, a flexible disc, a magneto-optic disc, a CD-ROM, a CD-R/W, a DVD, a DAT, an 8 mm tape, a memory card, etc are given as those removable from the computer.

Further, a hard disc, a Read-Only Memory (ROM), etc are given as the recording mediums fixed within the computer etc.

What is claimed is:

1. A computer aided design apparatus, comprising:
a memory; and
a processor connected to the memory, wherein the processor is configured to operate in accordance with executable instructions that, when executed, cause the processor to perform:
generating a signal characteristic of a transistor by simulating an operation of the transistor with simulation parameters using the processor;
extracting from the signal characteristic, characteristic values for distinguishing between a first signal characteristic generated by setting first values in the simulation parameter and a second signal characteristic generated by setting second values in the simulation parameters, at least any one of the second values being different from the first values, the characteristic values being different from the simulation parameters;
determining a first mapping relationship to the simulation parameters from the characteristic values with a combination of the characteristic values and set values, the characteristic values being respectively obtained by simulating the operation of the transistor with a plurality of combinations of the set values which are assigned to the simulation parameters using the processor, the first mapping relationship being mapping from a set of the characteristic values to a set of the set values which are assigned to the simulation parameters;
obtaining a third mapping relationship to the characteristic values from layout information by modeling and a calculation on the basis of plural combinations of information showing a relationship between the layout information of an area in which the transistor is formed and the characteristic values of the transistor; and
obtaining a fourth mapping relationship defined as mapping to the simulation parameters from the layout information by substituting a value obtained with application of the third mapping relationship being applied to the layout information into the characteristic value defined as an input value of the first mapping relationship,
wherein the determining of the first mapping relationship includes:
obtaining a second mapping relationship to the characteristic values from the simulation parameters, the second mapping relationship being expressed by a polynomial expression of simulation parameters, by determining one or more coefficients of the polynomial expression to fit the polynomial expression to the combination of the set values and the characteristic values obtained by the simulating; and transforming inversely the second mapping relationship into an inverse mapping of the polynomial expression, the inverse mapping being expressing the first mapping relationship.

2. The computer aided design apparatus according to claim 1, wherein the processor is configured to operate in accordance with executable instructions that, when executed, further cause the processor to perform:

setting a combination of characteristic values by setting a plurality of values as the characteristic values;

acquiring a combination of the simulation parameters corresponding to the combination of the characteristic values by inputting the combination of the characteristic values into the first mapping relationship;

generating the signal characteristics by the combination of the simulation parameters; and executing the processes of the extracting characteristic values and of the determining the first mapping relationship.

3. The computer aided design apparatus according to claim 1, wherein the processor is configured to operate in accordance with executable instructions that, when executed, further cause the processor to perform:

obtaining the characteristic values respectively by simulating the operation of the transistor with a plurality of combinations of the set values which are assigned to the simulation parameters.

4. A non-transitory storage medium storing a computer aided design program, upon being read into the computer, the program making a computer execute:

a simulation instruction instructing a simulation unit to generate a signal characteristic of a transistor by simulating an operation of the transistor with simulation parameters using the computer;

a characteristic value extraction extracting from the signal characteristic, characteristic values for distinguishing between a first signal characteristic generated by setting first values in the simulation parameters and a second signal characteristic generated by setting second values in the simulation parameters, at least any one of the second values being different from the first values, the characteristic values being different from the simulation parameters;

a simulation parameter determination determining a first mapping relationship to the simulation parameters from the characteristic values with a combination of the characteristic values and set values, the characteristic values being respectively obtained by simulating the operation of the transistor with a plurality of combinations of the set values which are assigned to the simulation parameters using the computer, the first mapping relationship being mapping from a set of the characteristic values to a set of the set values which are assigned to the simulation parameters;

obtaining a third mapping relationship to the characteristic values from layout information by modeling and a calculation on the basis of plural combinations of information showing a relationship between the layout information of an area in which the transistor is formed and the characteristic values of the transistor; and obtaining a fourth mapping relationship defined as mapping to the simulation parameters from the layout information by substituting a value obtained with application of the third mapping relationship being applied to the layout information into the characteristic value defined as an input value of the first mapping relationship, wherein the simulation parameter determination includes:

obtaining a second mapping relationship to the characteristic values from the simulation parameters, the second mapping relationship being expressed by a polynomial expression of simulation parameters, by determining one or more coefficients of the polynomial expression to fit the polynomial expression to the combination of the set values and the characteristic values obtained by the simulating; and transforming inversely the second mapping relationship into an inverse mapping of the polynomial expression, the inverse mapping being expressing the first mapping relationship.

5. The non-transitory storage medium storing the computer aided design program according to claim 4, wherein the computer is made to further execute:

a characteristic value decision setting a combination of characteristic values by setting a plurality of values as the characteristic values;

a simulation parameter acquisition acquiring a combination of the simulation parameters corresponding to the combination of the characteristic values by inputting the combination of the characteristic values into the first mapping relationship; and a control instructing the simulation instructing unit to generate the signal characteristics by the combination of the simulation parameters, and executing the processes in the characteristic value extraction and in the simulation parameter determination.

6. The non-transitory storage medium storing the computer aided design program according to claim 5, wherein the characteristic value decision includes setting the combination of the characteristic values on the basis of values equally allocated within a range of the values that can be taken as the signal characteristics of circuit components.

7. The non-transitory storage medium storing the computer aided design program according to claim 5, wherein the control includes repeatedly executing the characteristic values decision, simulation parameter acquisition, the simulation instruction, the characteristic value extraction and the simulation parameter determination, and the characteristic value decision includes setting a central value of the characteristic values and the characteristic values within the range of the values prescribed based on a predetermined deviation from the central value, and setting the characteristic values in a way that reduces the deviation each time the steps are repeatedly executed.

8. The non-transitory storage medium storing the computer aided design program according to claim 5, wherein the characteristic value decision includes setting the characteristic values by excluding the relationship among the plurality of characteristic values, which has a contradiction to the signal characteristics of the transistor.

9. A computer aided design method of a semiconductor device comprising:

a simulation instruction instructing a simulation unit to generate a signal characteristic of a transistor by simulating an operation of the transistor with simulation parameters using a computer;

a characteristic value extraction extracting from the signal characteristic, characteristic values for distinguishing between a first signal characteristic generated by setting first values in the simulation parameters and a second signal characteristic generated by setting second values in the simulation parameters, at least any one of the second values being different from the first values, the characteristic values being different from the simulation parameters;

a simulation parameter determination determining a first mapping relationship to the simulation parameters from the characteristic values with a combination of the characteristic values and set values, the characteristic values being respectively obtained by simulating the operation of the transistor with a plurality of combinations of the set values which are assigned to the simulation parameters using the computer, the first mapping relationship being mapping from a set of the characteristic values to a set of the set values which are assigned to the simulation parameters;

obtaining a third mapping relationship to the characteristic values from layout information by modeling and a calculation on the basis of plural combinations of information showing a relationship between the layout information of an area in which the transistor is formed and the characteristic values of the transistor; and obtaining a fourth mapping relationship defined as mapping to the simulation parameters from the layout information by substituting a value obtained with application of the third mapping relationship being applied to the layout information into the characteristic value defined as an input value of the first mapping relationship, wherein the simulation parameter determination includes:
obtaining a second mapping relationship to the characteristic values from the simulation parameters, the second mapping relationship being expressed by a polynomial expression of simulation parameters, by determining one or more coefficients of the polynomial expression to fit the polynomial expression to the combination of the set values and the characteristic values obtained by the simulating; and transforming inversely the second mapping relationship into an inverse mapping of the polynomial expression, the inverse mapping being expressing the first mapping relationship.

10. The computer aided design method according to claim 9, wherein the simulation parameter determination includes:
a model generation determining a second mapping relationship to the characteristic values from the simulation parameters by the combination of the characteristic values and the set values; and an inverse mapping determination determining the first mapping relationship to the simulation parameters from the characteristic values on the basis of the second mapping relationship.

11. The computer aided design method according to claim 10, wherein the simulation parameter determination further includes:
generating a combination of the characteristic values; and
respectively generating the simulation parameters corresponding to the combination of the characteristic values by applying the first mapping relationship to the combination of the characteristic values.

12. The computer aided design method according to claim 9, wherein the signal characteristics are described by a combination of a drain current value and a drain voltage value of the transistor or by a combination of the drain current value and a gate voltage value thereof, and
the characteristic values includes at least one of a plurality of drain current values in a predetermined drain voltage, a plurality of drain current values in a predetermined gate voltage value, a plurality of drain voltage values in a predetermined drain current value, a plurality of gate voltage values in a predetermined drain current value, a predetermined arithmetic result about the plurality of drain current values in the predetermined drain voltage, a predetermined arithmetic result about the plurality of drain current values in the predetermined gate voltage value, a predetermined arithmetic result about the plurality of drain voltage values in the predetermined drain current value, a predetermined arithmetic result about the plurality of gate voltage values in the predetermined drain current value, a parameter showing an degree of influence upon the signal characteristic of a substrate bias of a semiconductor substrate on which to assemble circuit components, a combination of a drain current value for at least one gate voltage value under a linear region condition of the transistor and a threshold value under the linear region condition, a combination of a drain current values for two gate voltage values under a saturation region condition of the transistor, a combination of drain current values for two drain voltage values under the saturation region condition of the transistor, a drain current value given when the substrate bias is set to a predetermined value, a combination of a drain current value for at least one gate voltage value under the linear region condition of the transistor, the threshold value under the linear region condition and drain current values for the two gate voltage values under the saturation region condition of the transistor, a combination of the drain current value for at least one gate voltage value under the linear region condition of the transistor, threshold value under the linear region condition, drain current values for the two gate voltage values under the saturation region condition of the transistor and drain current values for the two drain voltage values under the saturation region condition of the transistor, a mutual conductance as a ratio of a variation quantity of the drain current to a variation quantity of the gate voltage under the linear region condition of the transistor, a mutual conductance as a ratio of a variation quantity of the drain current to a variation quantity of the gate voltage under the saturation region condition of the transistor, the threshold value of the transistor, drain voltage dependency of the threshold value as a ratio of the variation quantity of the threshold value to a variation ratio of the drain voltage, and a floating body effect showing a degree of influence upon the signal characteristic when the substrate bias changes.

13. The computer aided design method according to claim 9, wherein the signal characteristics are described by a combination of a drain current value and a drain voltage value of the transistor or by a combination of the drain current value and a gate voltage value thereof, and
the combination of the drain current values contains the drain current value given when the gate voltage value is set to any one of a power source voltage, a value given when the gate voltage value is equal to or smaller than a half of a sum of the power source voltage and the threshold value, and the drain current value given when the drain voltage value is set to the power source voltage.

14. The computer aided design method according to claim 9, wherein the signal characteristics are described by a combination of a drain current value and a drain voltage value of the transistor or by a combination of the drain current value and a gate voltage value thereof, and
the simulation parameter contains at least one of a parameter showing a gate width, a gate length, a mobility of an electron and a degree of influence of the substrate bias, drain voltage dependency of a threshold value as a ratio by a variation quantity of a drain voltage to a variation quantity of the threshold value which is given when the drain voltage changes, and an impurity penetrating diffusion length showing a degree of the diffusion of an impurity under the gate.

15. The computer aided design method according to claim 9, further comprising:
obtaining a fifth mapping relationship to the characteristic values from process information with plural combinations of information showing a relationship between the process information used for the manufacturing process in which to manufacture the transistor and the characteristic values of the transistor; and
obtaining a sixth mapping relationship defined as the mapping to the simulation parameters from the process information by substituting a value obtained with application of the fifth mapping relationship being applied to the process information into the characteristic value as an input value of the first mapping relationship.

16. The computer aided design method according to claim 9, wherein the computer further executes:
a characteristic value decision setting a combination of characteristic values by setting a plurality of values as the characteristic values;
a simulation parameter acquisition acquiring a combination of the simulation parameters corresponding to the combination of the characteristic values by inputting the combination of the characteristic values into the first mapping relationship; and
a control instructing the simulation instructing unit to generate the signal characteristics by the combination of the simulation parameters, and executing the processes in the characteristic value extraction and in the simulation parameter determination.

17. The computer aided design method according to claim 16, wherein the characteristic value decision includes setting the combination of the characteristic values on the basis of values equally allocated within a range of the values that can be taken as the signal characteristics of circuit components.

18. The computer aided design method according to claim 16, wherein the characteristic value decision includes setting a central value of the characteristic values and a deviation values within the range of the values prescribed based on a deviation from the central value.

19. The computer aided design method according to claim 18, wherein the control includes repeatedly executing the characteristic values decision, simulation parameter acquisition, the simulation instruction, the characteristic value extraction and the simulation parameter determination, and
the characteristic value decision includes setting the characteristic values in a way that reduces the deviation values each time the steps are repeatedly executed.

20. The computer aided design method according to claim 16, wherein the characteristic value decision includes setting the characteristic values by excluding the relationship among the plurality of characteristic values, which has a contradiction to the signal characteristics of the transistor.

21. A method of manufacturing a semiconductor circuit comprising:
a simulation instruction instructing a simulation unit, generating a signal characteristic of a transistor by simulating an operation of the transistor with simulation parameters using a computer, to generate the signal characteristic;
a characteristic value extraction extracting, from the signal characteristic, characteristic values for distinguishing between a first signal characteristic generated by setting first values in the simulation parameters and a second signal characteristic generated by setting second values in the simulation parameters, at least any one of the second values being different from the first values, the characteristic values being different from the simulation parameters;
a simulation parameter determination determining a first mapping relationship to the simulation parameters from the characteristic values with a combination of the characteristic values and set values, the characteristic values being respectively obtained by simulating the operation of the transistor with a plurality of combinations of the set values which are assigned to the simulation parameters using the computer, the first mapping relationship being mapping from a set of the characteristic values to a set of the set values which are assigned to the simulation parameters;
obtaining the characteristic values based on the third mapping relationship for prescribing the relationship between the layout information of the area in which the transistor is formed and the characteristic values;
acquiring the simulation parameters from the characteristic values in accordance with the first mapping relationship;
obtaining operation characteristic values of a circuit including the transistors by executing circuit simulation that simulates an operation of the circuit on the basis of the simulation parameters; and
manufacturing a semiconductor circuit on the basis of the layout information when the operation characteristic values satisfy a predetermined condition,
wherein the simulation parameter determination includes:
obtaining a second mapping relationship to the characteristic values from the simulation parameters, the second mapping relationship being expressed by a polynomial expression of simulation parameters, by determining one or more coefficients of the polynomial expression to fit the polynomial expression to the combination of the set values and the characteristic values obtained by the simulating; and
transforming inversely the second mapping relationship into an inverse mapping of the polynomial expression, the inverse mapping being expressing the first mapping relationship.

22. The method according to claim 21, further comprising:
a characteristic value decision setting a combination of plural characteristic values by setting a plurality of values as the characteristic values;
a simulation parameter acquisition acquiring a combination of the simulation parameters corresponding to the combination of the characteristic values by inputting the combination of the characteristic values into the first mapping relationship; and
a control instructing the simulation instructing unit to generate the signal characteristics by the combination of the simulation parameters, and executing the processes in the characteristic value extraction and in the simulation parameter determination.

23. The method according to claim 21, wherein the characteristic values from the signal characteristic are generated by simulating the operation of the transistor with simulation parameters in the characteristic value extraction extracting using the computer.

* * * * *